(12) United States Patent
Jeng et al.

(10) Patent No.: US 10,535,632 B2
(45) Date of Patent: Jan. 14, 2020

(54) SEMICONDUCTOR PACKAGE STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Shin-Puu Jeng, Hsinchu (TW); Feng-Cheng Hsu, New Taipei (TW); Shuo-Mao Chen, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/388,434

(22) Filed: Dec. 22, 2016

(65) Prior Publication Data

US 2018/0068978 A1    Mar. 8, 2018

Related U.S. Application Data

(60) Provisional application No. 62/382,912, filed on Sep. 2, 2016.

(51) Int. Cl.
| | |
|---|---|
| *H01L 25/065* | (2006.01) |
| *H01L 23/00* | (2006.01) |
| *H01L 21/56* | (2006.01) |
| *H01L 23/31* | (2006.01) |

(52) U.S. Cl.
CPC .......... *H01L 25/0652* (2013.01); *H01L 21/56* (2013.01); *H01L 23/3114* (2013.01); *H01L 24/02* (2013.01); *H01L 24/17* (2013.01); *H01L 2224/02372* (2013.01); *H01L 2224/17104* (2013.01); *H01L 2225/06544* (2013.01); *H01L 2225/06582* (2013.01)

(58) Field of Classification Search
CPC . H01L 25/071; H01L 25/062; H01L 23/3114; H01L 21/4821–4282; H01L 23/49861; H01L 23/495–49596
See application file for complete search history.

(56) References Cited

U.S. PATENT DOCUMENTS

| | | | |
|---|---|---|---|
| 7,564,115 B2 | 7/2009 | Chen et al. | |
| 7,633,165 B2 | 12/2009 | Hsu et al. | |
| 7,825,024 B2 | 11/2010 | Lin et al. | |
| 7,973,413 B2 | 7/2011 | Kuo et al. | |

(Continued)

*Primary Examiner* — Tucker J Wright
*Assistant Examiner* — Wilner Jean Baptiste
(74) *Attorney, Agent, or Firm* — WPAT, P.C., Intellectual Property Attorneys; Anthony King

(57) ABSTRACT

A semiconductor package structure includes a redistribution (RDL) layer, a first chip, at least one second chip, an encapsulant and a third chip. The redistribution layer has a first surface and a second surface opposite to each other. The first chip is over the first surface of the redistribution layer and electrically connected to the redistribution layer. The second chip is over the first surface of the redistribution layer. The second chip includes a plurality of through via structures. The encapsulant is over the first surface of the distribution layer, wherein the encapsulant surrounds the first chip and the second chip. The third chip is over the encapsulant and electrically connected to the first chip through the through via structures of the second chip and the redistribution layer.

20 Claims, 38 Drawing Sheets

(56) References Cited

U.S. PATENT DOCUMENTS

| | | |
|---|---|---|
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,426,961 B2 | 4/2013 | Shih et al. |
| 8,669,174 B2 | 3/2014 | Wu et al. |
| 8,802,504 B1 | 8/2014 | Hou et al. |
| 8,803,292 B2 | 8/2014 | Chen et al. |
| 8,803,316 B2 | 8/2014 | Lin et al. |
| 2003/0164550 A1* | 9/2003 | Lee ............... H01L 25/0652 257/777 |
| 2010/0133704 A1* | 6/2010 | Marimuthu ........ H01L 21/565 257/778 |
| 2012/0106117 A1* | 5/2012 | Sundaram ....... H01L 23/49827 361/808 |
| 2013/0122700 A1* | 5/2013 | Wu ............... H01L 21/6835 438/613 |
| 2014/0001645 A1 | 1/2014 | Lin et al. |
| 2014/0103488 A1* | 4/2014 | Chen ............. H01L 23/5389 257/532 |
| 2014/0191379 A1* | 7/2014 | Zhang ............ H01L 23/3107 257/669 |
| 2014/0225258 A1 | 8/2014 | Chiu et al. |
| 2014/0252572 A1 | 9/2014 | Hou et al. |
| 2015/0287697 A1 | 10/2015 | Tsai et al. |
| 2015/0348872 A1 | 12/2015 | Kuo et al. |

\* cited by examiner

SEMICONDUCTOR PACKAGE STRUCTURE AND METHOD OF MANUFACTURING THE SAME

This application claims priority of U.S. provisional application Ser. No. 62/382,912 filed on 2 Sep. 2016, which is incorporated by reference in its entirety.

BACKGROUND

In an attempt to further increase circuit density and reduce costs, three-dimensional (3D) semiconductor package structures have been developed. With the evolving of semiconductor technologies, semiconductor devices are becoming increasingly smaller, while more functions need to be integrated into the semiconductor devices. Accordingly, the semiconductor devices need to have increasingly greater numbers of input/output (I/O) terminals packaged into smaller areas, and the density of the I/O terminals rises quickly with time. As a result, the packaging of the semiconductor devices becomes more difficult, which adversely affects the yield of the packaging.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
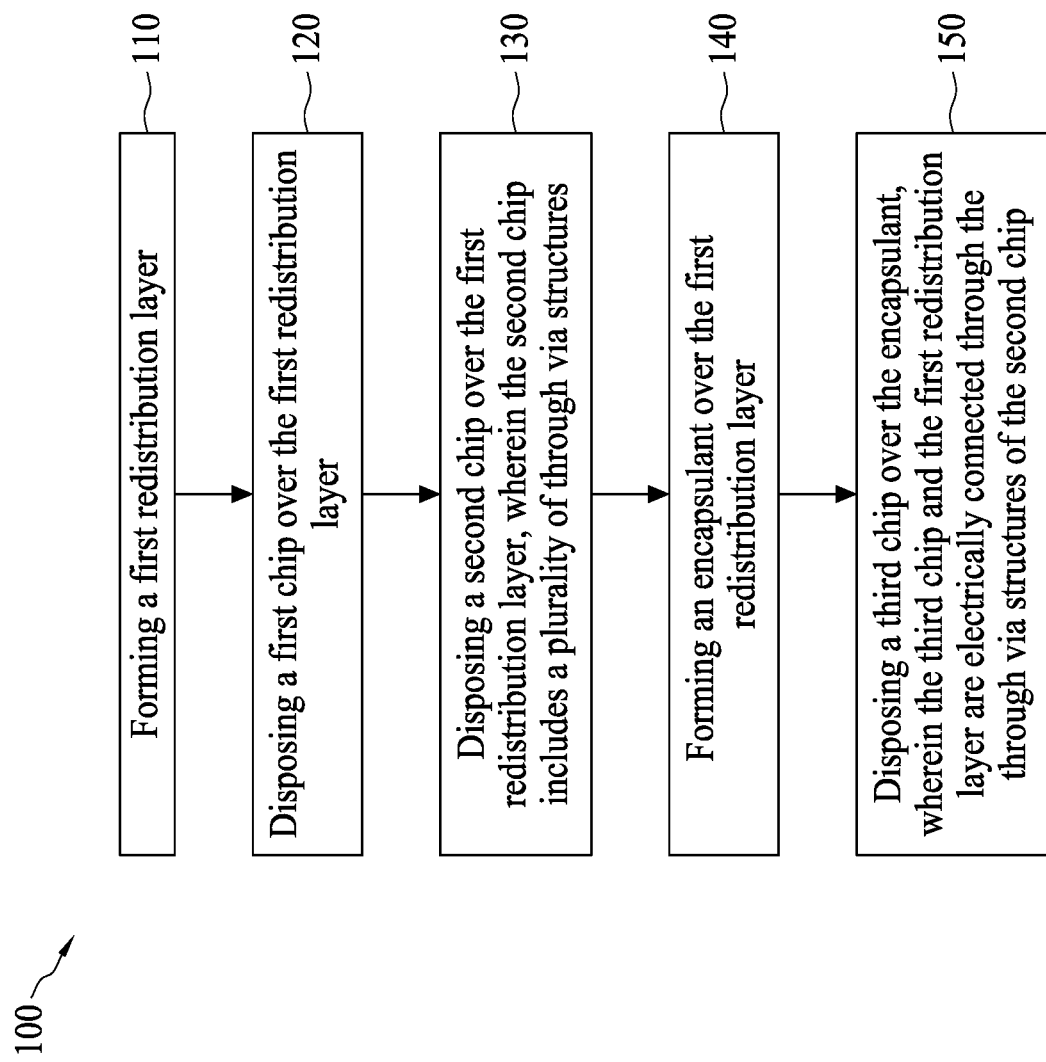
FIG. 1 is a flow chart illustrating a method for manufacturing a semiconductor package structure according to various aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the term "carrier substrate" or "temporary substrate" refers to a carrier configured as an intermediate substrate for facility of fabrication of overlying layer such as redistribution layer, chip, encapsulant and other structures, or for dicing. The carrier substrate or the temporary substrate provides temporary supporting and fixing functions, and will be removed from the overlying structure.

As used herein, the term "redistribution layer (RDL)" refers to a layer stack formed from at least one conductive pattern and at least one insulation layer, and configured to electrically communicate with two or more devices.

As used herein, the term "conductive bump" refers to a conductor configured to electrically interconnecting two conductive structures through its two ends. In one or more embodiments, the conductive bump is formed of a low melting point material, which can be formed by low temperature operation. The conductive bump is formed prior to formation of the encapsulant which surrounds sidewalls of the interconnecting bump. In one or more embodiments, the conductive bump is a solder bump, a solder paste, or the like.

As used herein, the term "conductive post" refers to a conductor formed by deposition, photolithography and etching operations, which can implement fine pitch.

As used herein, the term "interposer" is an interconnection structure configured to electrically connecting two or more electronic devices such as chips, redistribution layers or packages disposed on two opposite surfaces of the interconnection structure. In one or more embodiments, the interposer is a pre-formed interconnection structure, which can be disposed on one of the electronic devices to be interconnected to another electronic device. In one or more embodiments, the interposer includes a number of through via structures such as through silicon vias (TSVs) with fine pitch.

As used herein, the term "through insulator via (TIV)" is a conductor through an insulator and configured to electrically connect two conductive structures through its two ends.

In one or more embodiments of the present disclosure, the semiconductor package structure includes chips in an encapsulant and between two electronic devices, and each of the electronic devices independently includes a redistribution layer, a semiconductor die or a package. In one or more embodiments, a portion of the chips includes through via structures such as TSVs configured to provide high density interconnection between the two electronic devices, while another portion of the chips is electrically connected to one of the electronic devices without through via structures. The chip with through via structures provides a short signal path for the interconnection between the two electronic devices. In some embodiments, the chip with through via structures is an interposer without active device integrated therein. In some embodiments, the chip with through via structures is an active device chip including TSVs integrated therein. In one or more embodiments, through insulator vias (TIVs) may be arranged in the encapsulant to provide an additional signal path between the two electronic devices to increase routing flexibility. In one or more embodiments, the semiconductor package structure is a fan-out wafer-level package (FOWLP).

FIG. 1 is a flow chart illustrating a method for manufacturing a semiconductor package structure according to various aspects of the present disclosure. The method 100 begins with operation 110 in which a first redistribution layer is formed. The method 100 continues with operation 120 in which a first chip is disposed over the first redistribution layer. The method 100 proceeds with operation 130 in which a second chip is disposed over the first redistribution layer, where the second chip includes a plurality of through via structures. The method 100 proceeds with operation 140 in which an encapsulant is formed over the first redistribution layer. The method 100 proceeds with operation 150 in which a third chip is disposed over the encapsulant, where the third chip and the first redistribution layer are electrically connected through the through via structures of the second chip.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
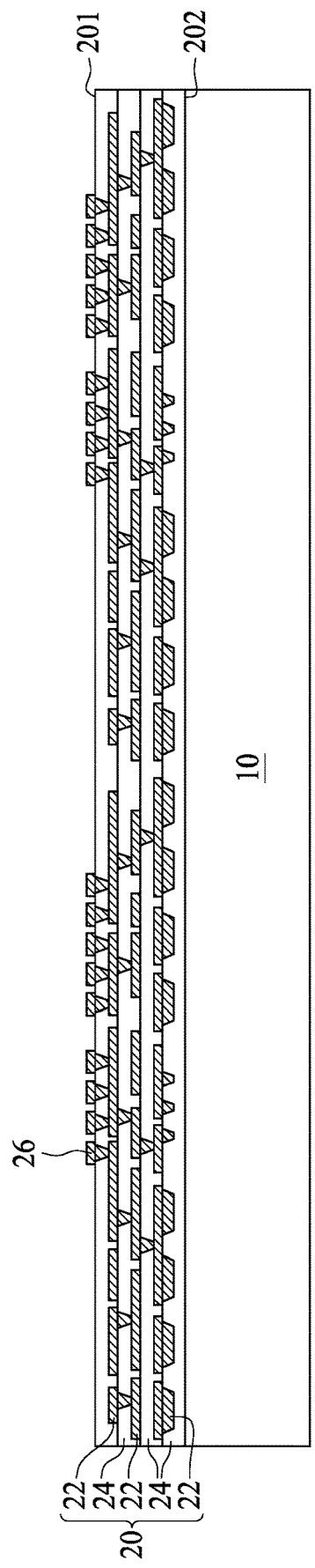
FIG. 2A, FIG. 2B, FIG. 2C, FIG. 2D, FIG. 2E, FIG. 2F, FIG. 2G, FIG. 2H, FIG. 2I, FIG. 2J and FIG. 2K are cross-sectional views at one of various operations of manufacturing semiconductor package structure according to one or more embodiments of the present disclosure.

FIG. 2A, FIG. 2B, FIG. 2C, FIG. 2D, FIG. 2E, FIG. 2F, FIG. 2G, FIG. 2H, FIG. 2I, FIG. 2J and FIG. 2K are cross-sectional views at one of various operations of manufacturing semiconductor package structure according to one or more embodiments of the present disclosure. As depicted in FIG. 2A, a first redistribution layer 20 is formed over a carrier substrate 10. In one or more embodiments, the carrier substrate 10 is configured as a temporary carrier for forming a redistribution layer such as a first redistribution layer 20, and will be removed subsequently. In one or more embodiments, the carrier substrate 10 is an insulative substrate such as a glass substrate. The carrier substrate 10 may include a semiconductor substrate such as a silicon substrate, a conductive substrate such as a metal substrate, or other suitable substrate.

The first redistribution layer 20 has a first surface 201 and a second surface 202 opposite to each other. In some embodiments, the second surface 202 of the first redistribution layer 20 faces the carrier substrate 10. The first redistribution layer 20 is formed by at least one conductive layer 22 and at least one insulative layer 24, and configured to electrically communicate with two or more chips. In one or more embodiments, the first redistribution layer 20 includes several conductive layers 22 and several insulative layers 24 stacked with one another. In some embodiments, the material of the conductive layer(s) 22 may include, but is not limited to, metal such as copper, titanium, the like, or a combination thereof. The material of the insulative layer(s) 24 may include, but is not limited to, inorganic and/or organic insulative material.

In one or more embodiments, the conductive layers 22 include different patterns, and are electrically connected to one another. In one or more embodiments, a portion of an upmost conductive layer 22 is exposed from the first surface 201 of the first redistribution layer 20. In one or more embodiments, several bonding pads 26 such as under bump metallurgies (UBMs) are formed over and electrically connected to the exposed portion of the upmost conductive layer 22 of the first redistribution layer 20.

Figure 2B:
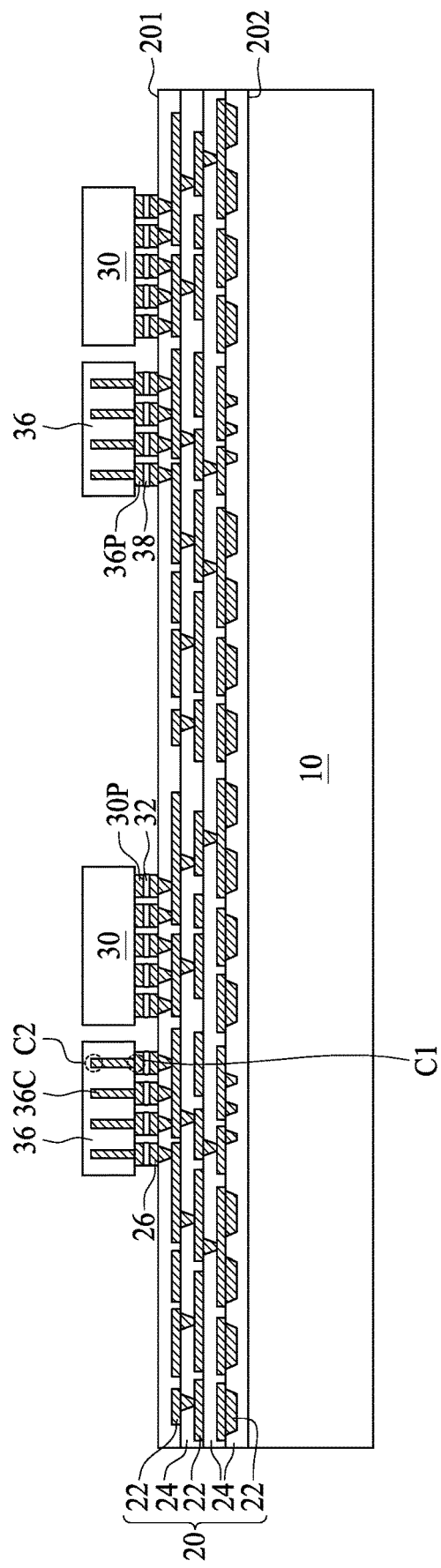

As depicted in FIG. 2B, one or more first chips 30 are disposed over the first surface 201 of the first redistribution layer 20. In one or more embodiments, the first chips 30 are electrically connected to the first redistribution layer 20. In one or more embodiments, the first chips 30 include active device chips and/or passive device chips. By way of examples, the active device chip may include system on chip (SOC) and/or other chips. The passive device chip may include resistors, capacitors, inductors or a combination thereof formed therein. In some embodiments, the passive device chip may be in the form of integrated circuit, but not limited thereto. The first chips 30 may be mounted on the first redistribution layer 20 through surface mount technology (SMT) or other suitable bonding technologies. In some embodiments, the first chip 30 includes several electrical terminals 30P, and the first chips 30 are electrically connected to the first redistribution layer 20 by bonding the electrical terminals 30P to a portion of the bonding pads 26 through conductive materials 32 such as conductive pastes, conductive bumps or other suitable conductive materials.

One or more second chips 36 are disposed over the first redistribution layer 20, and electrically connected to the first redistribution layer 20. In one or more embodiments, the second chip 36 includes a number of interconnects such as through via structures 36C. By way of example, the through via structures 36C are through silicon vias (TSVs). The second chip 36 is configured to interconnect the first redistribution layer 20 and another device such as a third chip or a second redistribution layer disposed on two opposite sides, and fine pitch between adjacent through via structures 36C can be implemented. In some embodiments, the second chip 36 is an interposer formed in the form of integrated circuit without active device integrated therein. In some embodiments, the second chip 36 is an active device chip such as SOC including TSVs integrated therein. In one or more embodiments, the second chip 36 may further include embedded passive devices such as metal-insulator-metal (MIM) capacitor. The second chips 36 may be mounted on the first redistribution layer 20 through SMT or other suitable bonding technologies. In some embodiments, the second chip 36 includes several contact pads 36P, and the second chips 36 are electrically connected to the first redistribution layer 20 by bonding the contact pads 36P to another portion of the bonding pads 26 through conductive materials 38 such as conductive pastes, conductive bumps or other suitable conductive materials. In one or more embodiments, the second chip 36 and the first chip 30 have substantially the same height, and are at substantially the same level. In one or more embodiments, the through via structure 36C includes two terminals, where a first terminal C1 of the through via structure 36C is coupled to the first redistribution layer 20 through, for example, the contact pad 36P, and a second terminal C2 of the through via structure 36C is configured to be coupled to third chip(s) or second redistribution layer to be formed. In one or more embodiments, the second terminals C2 of the through via structures 36C are embedded in the second chip 36, and will be exposed in successive operation.

Figure 2C:
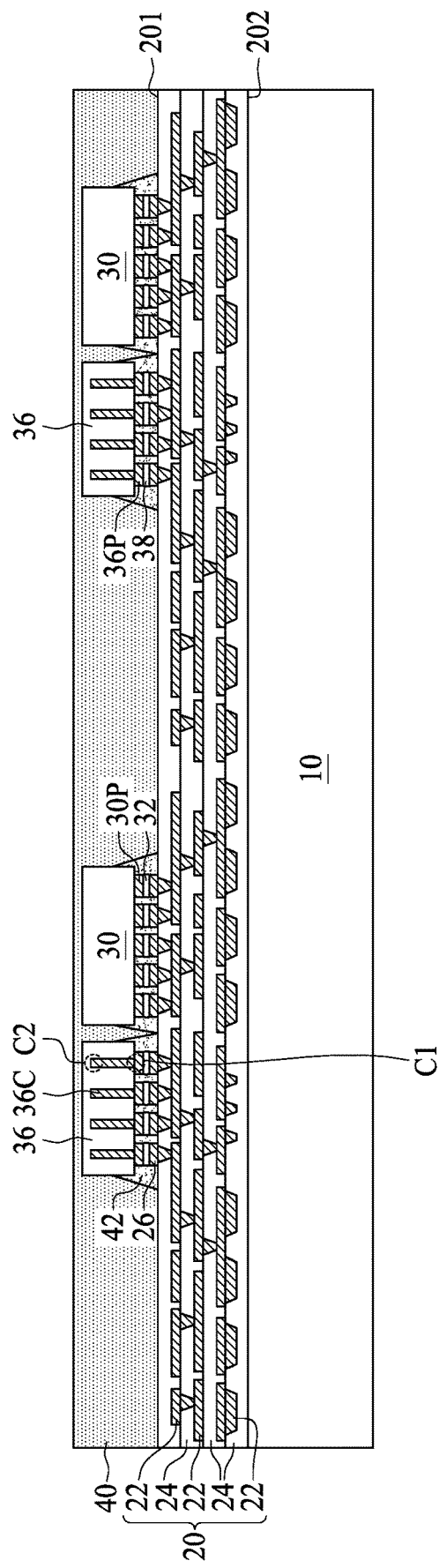

As depicted in FIG. 2C, an encapsulant such as a first encapsulant 40 is formed over the first surface 201 of first redistribution layer 20. In one or more embodiments, the material of the first encapsulant 40 is a molding compound. In some embodiments, an underfill layer 42 may be formed between the first chip 30 and the first redistribution layer 20, and between the second chip 36 and the first redistribution layer 20. In some embodiments, the first encapsulant 40 is a molding underfill (MUF) layer and thus an additional underfill layer may not be required. In one or more embodiments, the first encapsulant 40 covers upper surfaces and sidewalls of the first chip 30 and the second chip 36.

Figure 2D:
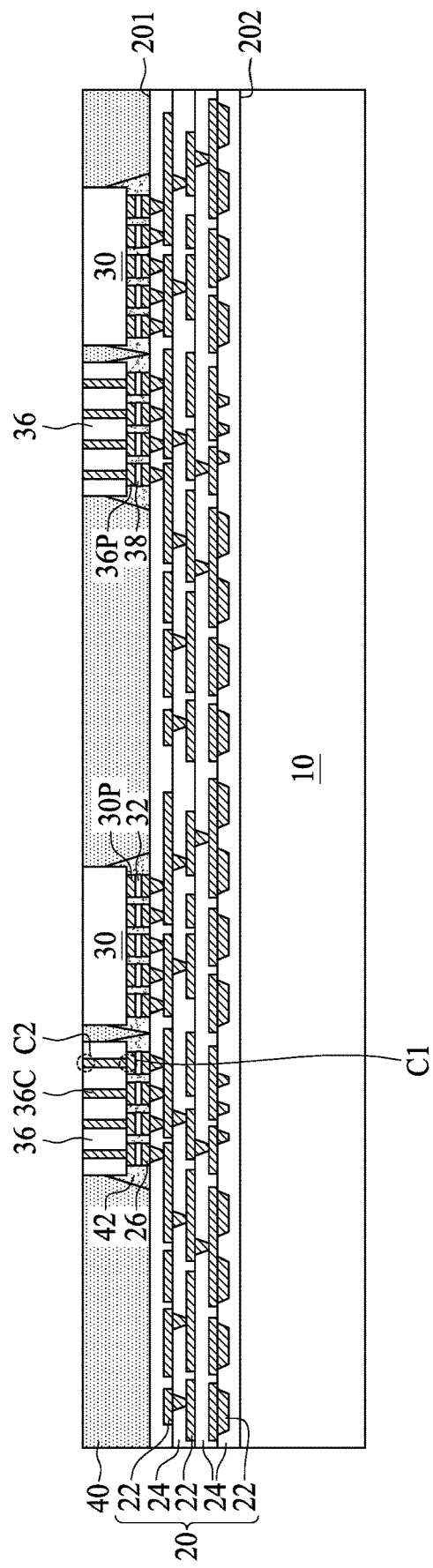

As depicted in FIG. 2D, a portion of the first encapsulant 40 is removed to expose the second terminals C2 of the second chip 36. In one or more embodiments, the first encapsulant 40 is thinned by grinding.

Figure 2E:
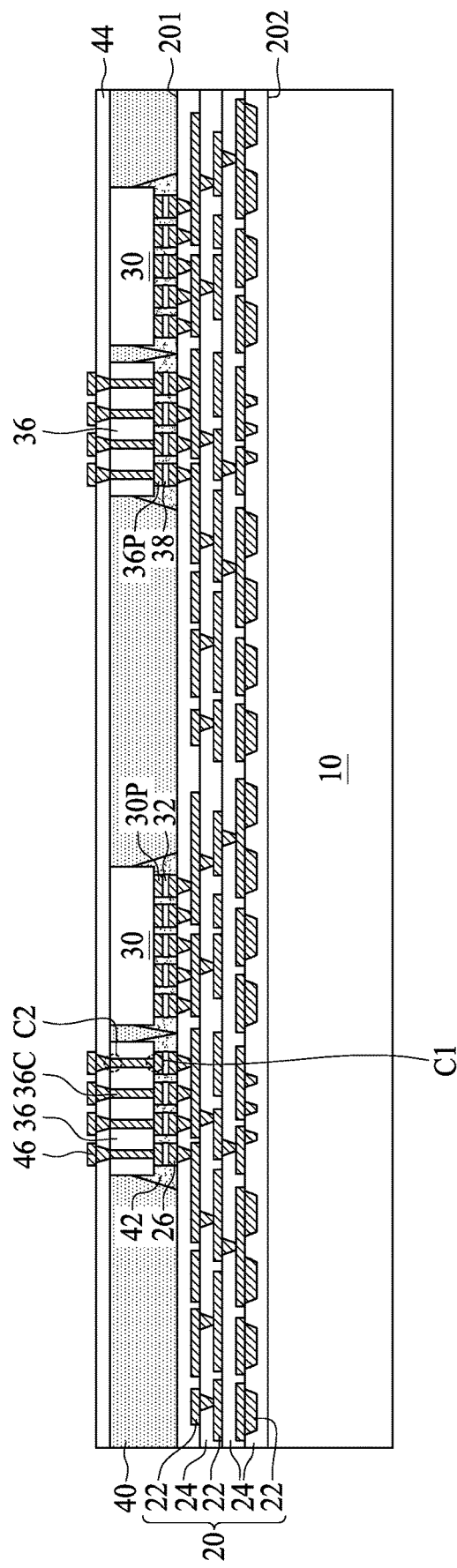

As depicted in FIG. 2E, an insulative layer 44 is formed over the first encapsulant 40. In one or more embodiments, the material of the insulative layer 44 may include, but is not limited to, organic insulative material such as PBO. The insulative layer 44 includes a number of openings exposing the second terminals C2 of the second chip 36. Several of bonding pads 46 are formed over the insulative layer 44 and electrically connected to the second terminals C2 of the second chip 36 through the openings of the insulative layer 44. In one or more embodiments, the bonding pads 46 may include, but not limited to, under bump metallurgies (UBMs).

Figure 2F:
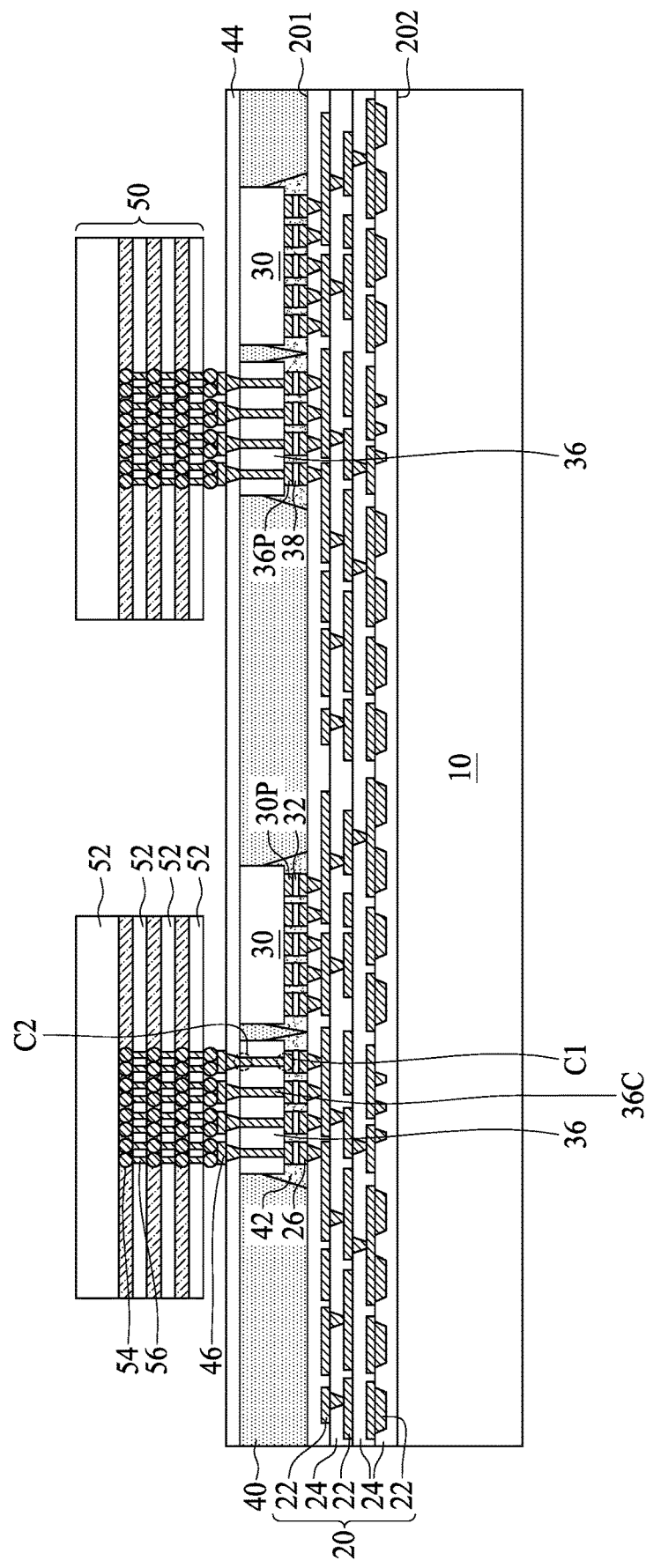

As depicted in FIG. 2F, one or more third chips 50 are disposed over the first encapsulant 40, and electrically connected to the second chips 36. In one or more embodiments, the third chip 50 includes a package or a memory chip. By way of example, the third chip 50 includes several DRAM devices 52 stacked and electrically connected to one another. In one or more embodiments, the DRAM devices 52 include through via structures 56 and are electrically connected to one another through interconnectors 54 such as micro conductive bumps. The third chips 50 may be mounted on the second chip 36 through SMT or other suitable bonding technologies. In some embodiments, the third chips 50 are electrically connected to the bonding pads 46 of the second chip 36 through conductive materials 48 such as conductive pastes, conductive bumps or other suitable conductive materials.

Figure 2G:
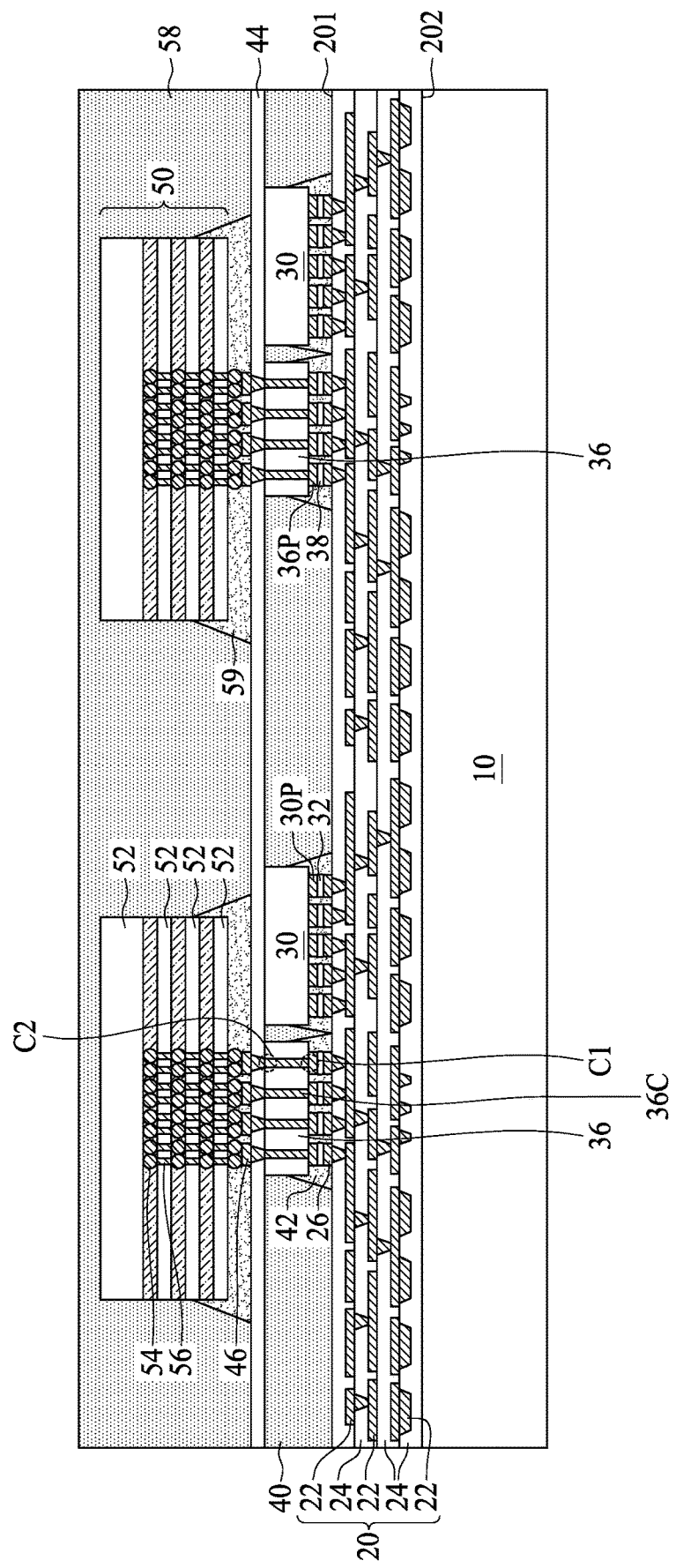

As depicted in FIG. 2G, a second encapsulant 58 is formed over the first encapsulant 40. In one or more embodiments, the material of the second encapsulant 58 is a molding compound. In some embodiments, an underfill layer 59 may be formed between the third chip 50 and the first encapsulant 40. In some embodiments, the second encapsulant 58 is a molding underfill (MUF) layer and thus an additional underfill layer is not required. In one or more embodiments, the second encapsulant 58 covers an upper surface and a sidewall of the third chip 50. In some embodiments, the third chips 50 may include optoelectronic chips such as CMOS image sensor chips, MEMS chips, memory chips, high power chips, and the second encapsulant 58 may be thinned e.g., by grinding, to expose upper surfaces of the third chip 50.

Figure 2H:
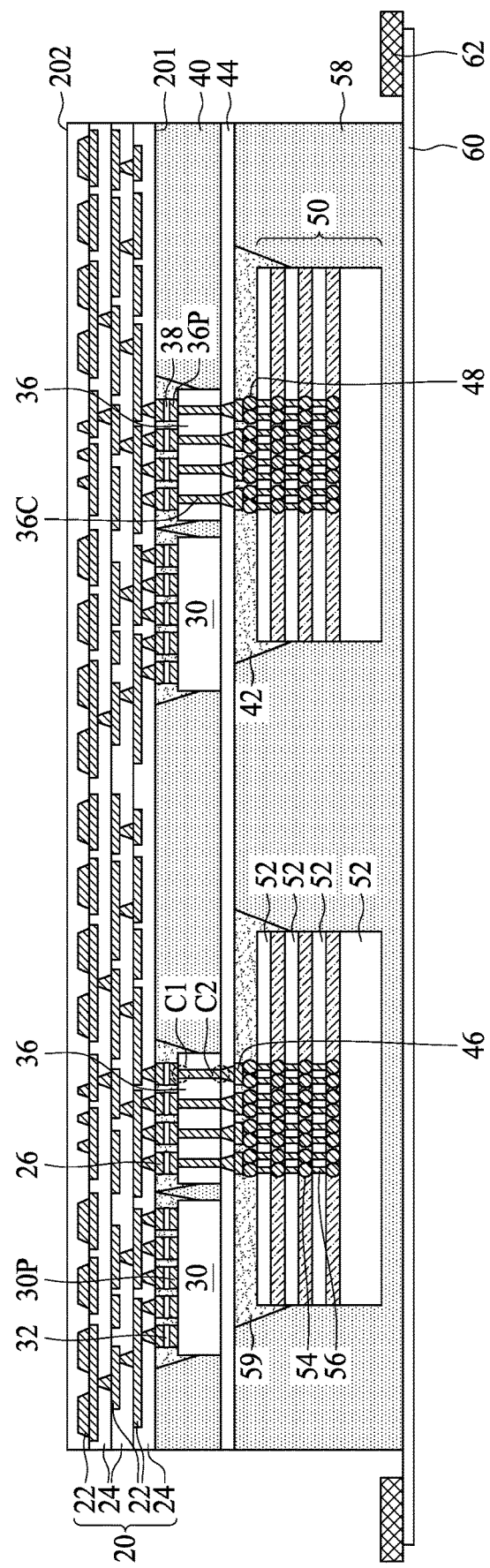

As depicted in FIG. 2H, the second encapsulant 58 is attached to a temporary substrate 60. In one or more embodiments, the temporary substrate 60 is a flexible film such as a tape fixed on a frame 62. In some embodiments, the temporary substrate 60 may include other types of substrates such as a rigid substrate. The carrier substrate 10 is then detached from the second surface 202 of the first redistribution layer 20.

Figure 2I:
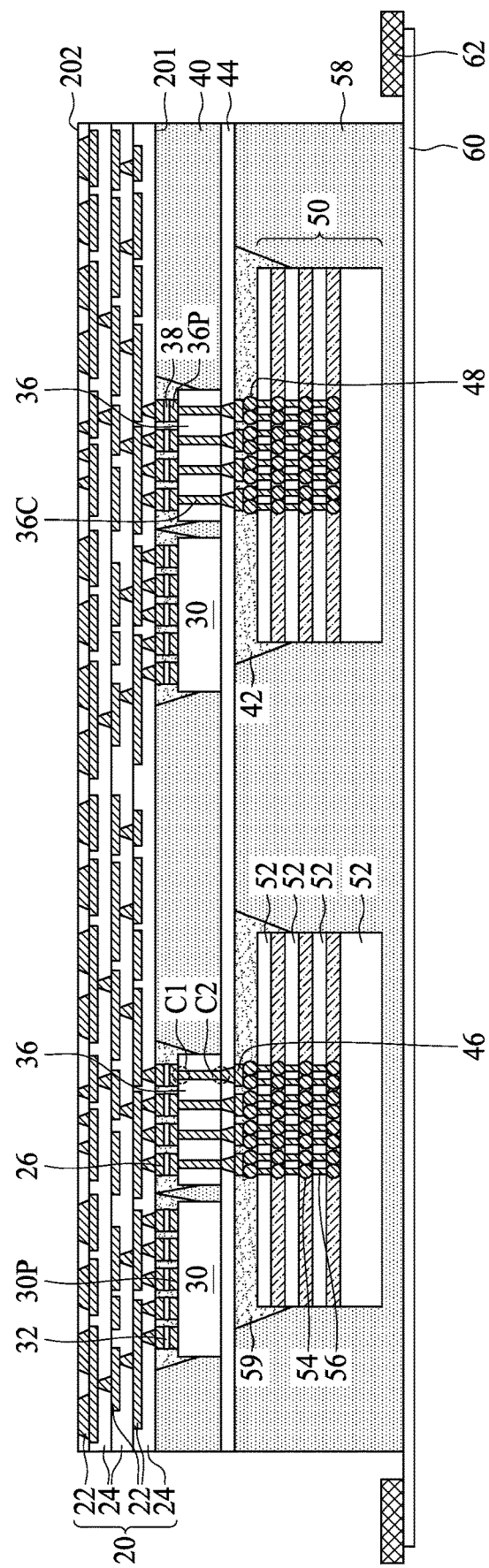

As depicted in FIG. 2I, a portion of the first redistribution layer 20 is removed from the second surface 202 to expose a bottommost conductive layer 22 configured as bonding pads. In one or more embodiments, the first redistribution layer 20 is removed by etching such as dry etching.

Figure 2J:
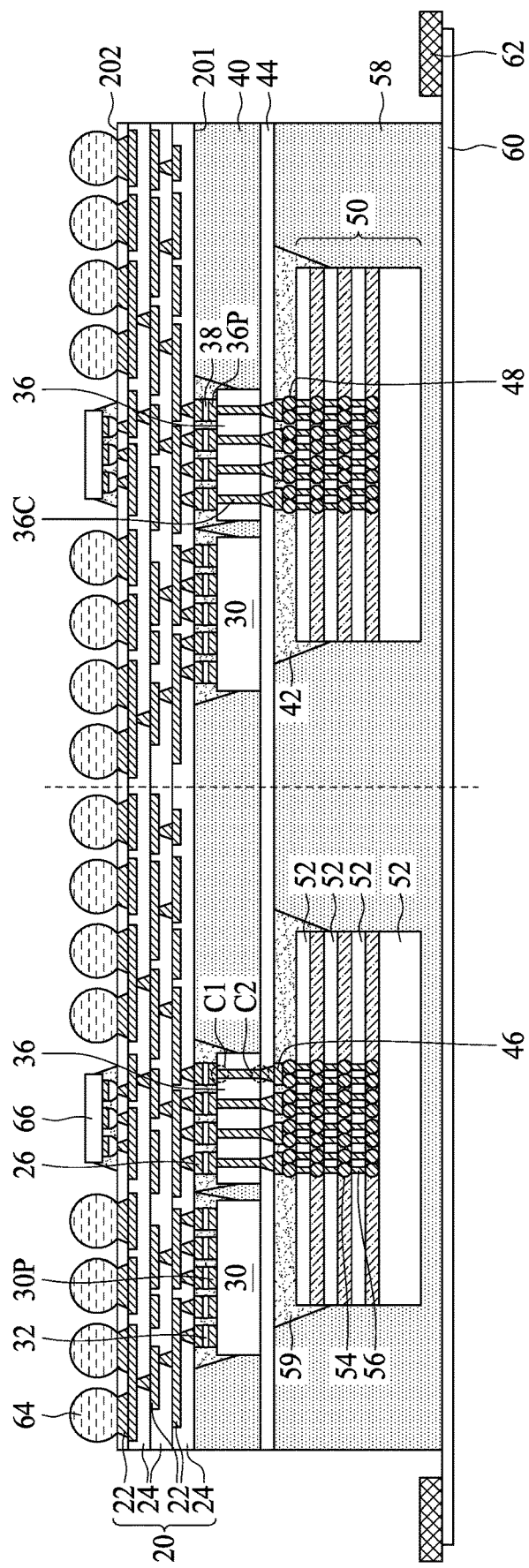
Figure 2K:
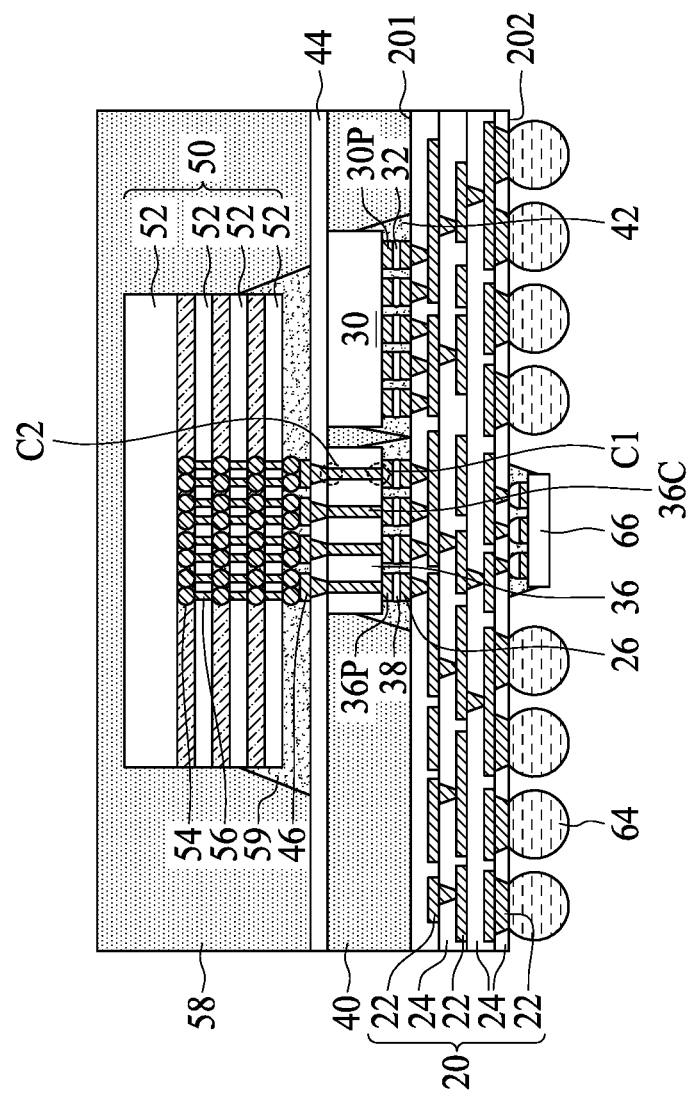

As depicted in FIG. 2J, a number of conductors 64 are formed over the second surface 202 of the first redistribution layer 20 and electrically connected to the first redistribution layer 20. In one or more embodiments, the conductors 64 include, but are not limited to, conductive bumps. In one or more embodiments, one or more fourth chips 66 are disposed over the second surface 202 of the first redistribution layer 20 and electrically connected to the first redistribution layer 20. In one or more embodiments, the fourth chips 66 include passive device chips. By way of examples, the passive device chip may include resistors, capacitors, inductors or a combination thereof formed therein. In some embodiments, the passive device chip may be in the form of integrated circuit, but not limited thereto. In one or more embodiment, a singulation operation is performed to form a number of semiconductor package structures 1. The semiconductor package structure 1 is then removed from the temporary substrate 60 as shown in FIG. 2K.

In the semiconductor package structure 1, the first chip 30 is electrically connected to the first redistribution layer 20 through the electrical terminals 30P facing the first redistribution layer 20. The third chip 50 is electrically connected to the first redistribution layer 20 through the second chip 36 having through via structures 36C with fine pitch. The second chip 36 provides a short signal path for the interconnection between the first chip 30 and the third chip 50. The second chip 36 avoids formation of through via structures in the first chip 30, which helps to improve yield of the first chip 30. The second chip 36 is configured to provide an increased number of I/O counts, which is integratable with chips with high I/O density such as memory chip.

The semiconductor package structure of the present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 3:
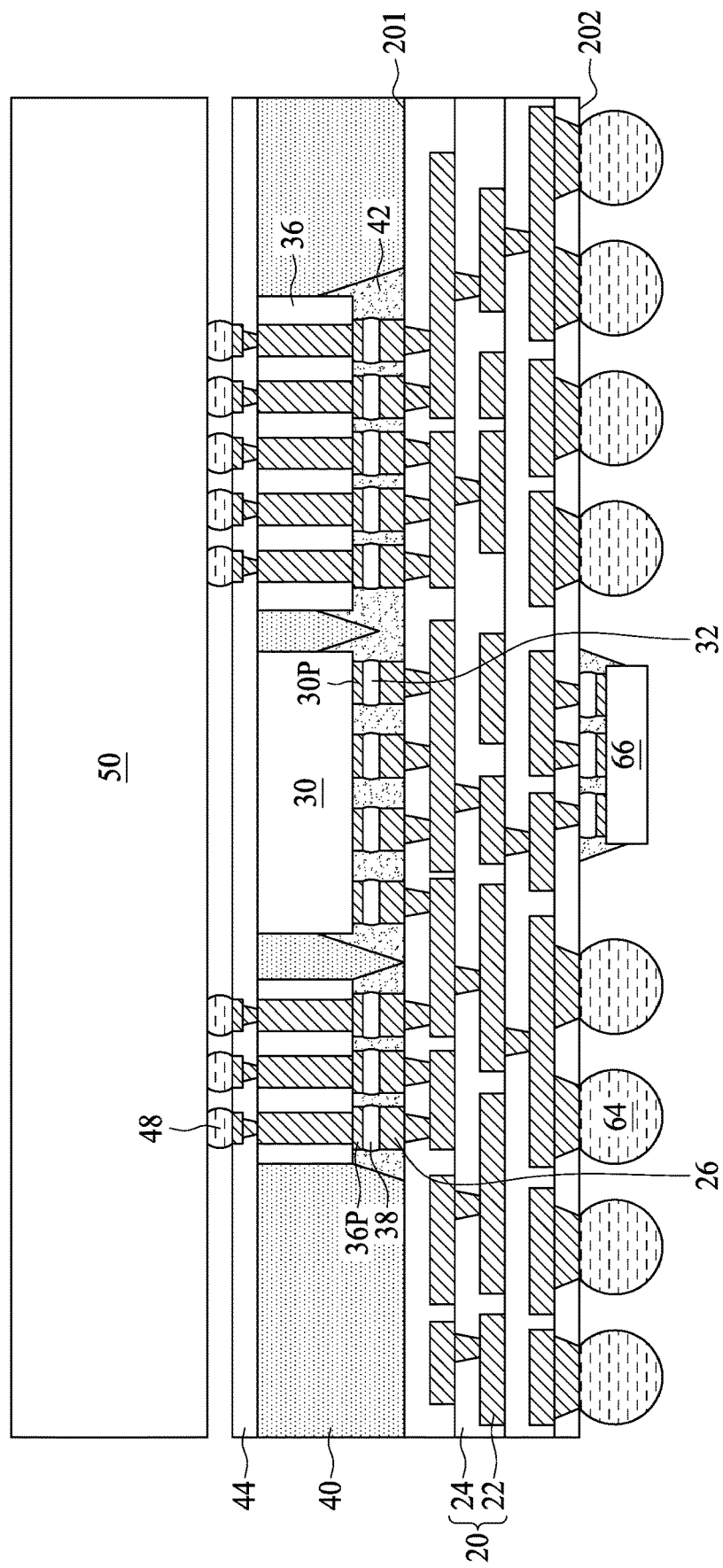
FIG. 3 is a cross-sectional view of a semiconductor package structure according to one or more embodiments of the present disclosure.

FIG. 3 is a cross-sectional view of a semiconductor package structure according to one or more embodiments of the present disclosure. As depicted in FIG. 3, the semiconductor package structure 2 includes two or more second chips 36 disposed over the first redistribution layer 20 and electrically connected to the third chip 50 and the first redistribution layer 20.

Figure 4A:
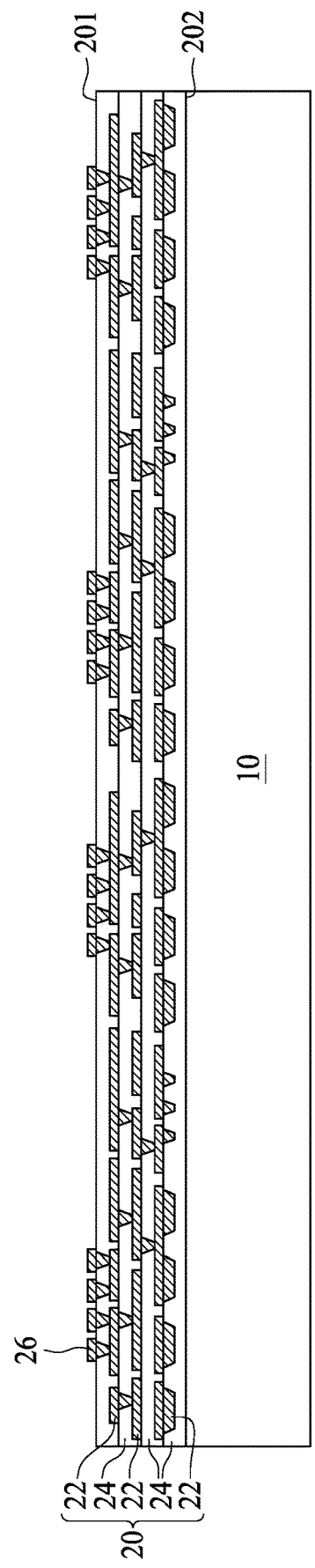
FIG. 4A, FIG. 4B, FIG. 4C, FIG. 4D, FIG. 4E, FIG. 4F, FIG. 4G, FIG. 4H, FIG. 4I, FIG. 4J and FIG. 4K are cross-sectional views at one of various operations of manufacturing semiconductor package structure according to one or more embodiments of the present disclosure.

FIG. 4A, FIG. 4B, FIG. 4C, FIG. 4D, FIG. 4E, FIG. 4F, FIG. 4G, FIG. 4H, FIG. 4I, FIG. 4J and FIG. 4K are cross-sectional views at one of various operations of manufacturing semiconductor package structure according to one or more embodiments of the present disclosure. As depicted in FIG. 4A, a first redistribution layer 20 is formed over a carrier substrate 10. The first redistribution layer 20 has a first surface 201 and a second surface 202 opposite to each other. In some embodiments, the second surface 202 of the first redistribution layer 20 faces the carrier substrate 10. The first redistribution layer 20 is formed by at least one conductive layer 22 and at least one insulative layer 24, and configured to electrically communicate with two or more chips. In one or more embodiments, a portion of an upmost conductive layer 22 is exposed from the first surface 201 of the first redistribution layer 20. In one or more embodiments, several bonding pads 26 such as under bump metallurgies (UBMs) are formed over and electrically connected to the exposed portion of the upmost conductive layer 22 of the first redistribution layer 20.

Figure 4B:
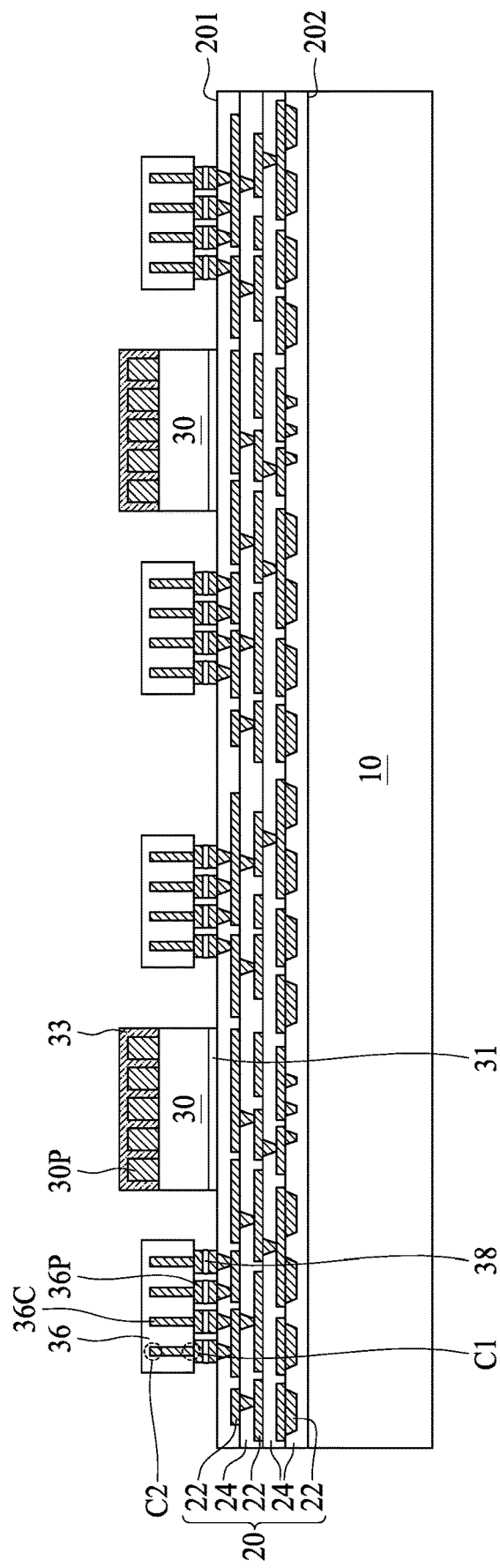

As depicted in FIG. 4B, one or more first chips 30 are disposed over the first surface 201 of the first redistribution layer 20. In one or more embodiments, the first chip 30 includes several electrical terminals 30P facing away from the first surface 201 of the first redistribution layer 20. In some embodiments, the electrical terminals 30P are covered with and protected by a passivation layer 33 such as a polymeric layer. In one or more embodiments, the first chip 30 is bonded to the first surface 201 of the first redistribution layer 20 through an adhesive layer 31 such as a die attaching film (DAF). One or more second chips 36 are disposed over the first redistribution layer 20, and electrically connected to the first redistribution layer 20.

Figure 4C:
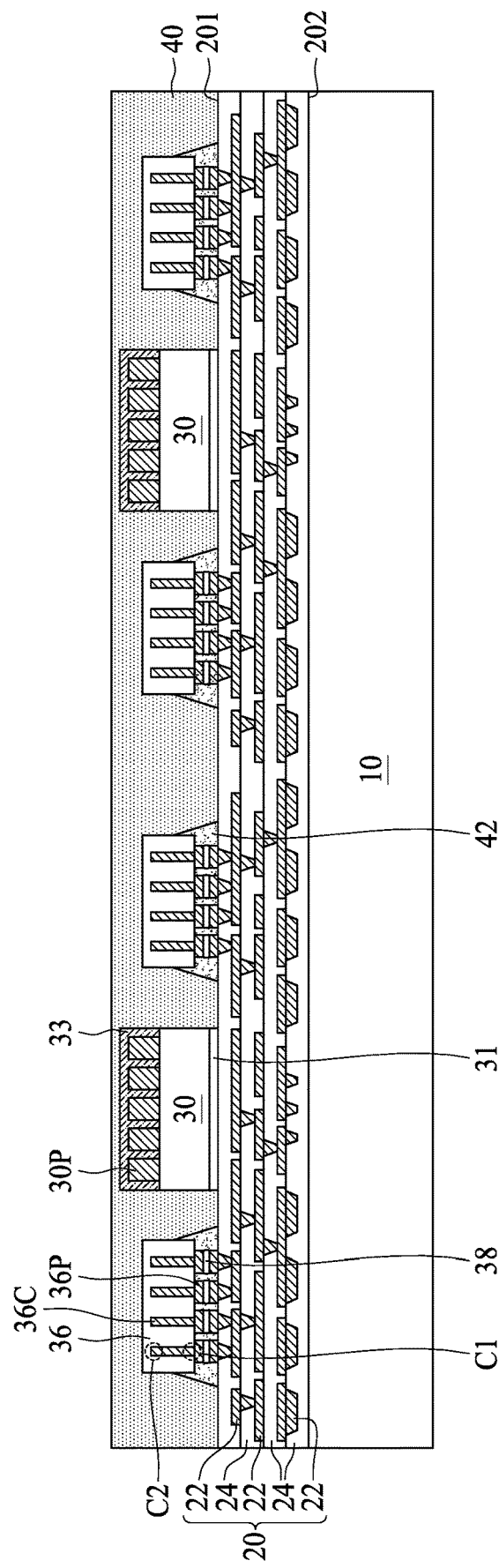

As depicted in FIG. 4C, a first encapsulant 40 is formed over the first surface 201 of first redistribution layer 20. In one or more embodiments, the material of the first encapsulant 40 is a molding compound. In some embodiments, an underfill layer 42 may be formed between the first chip 30 and the first redistribution layer 20, and between the second chip 36 and the first redistribution layer 20. In some embodiments, the first encapsulant 40 is a molding underfill (MUF) layer and thus an additional underfill layer is not required. In one or more embodiments, the first encapsulant 40 covers upper surfaces and sidewalls of the first chip 30 and the second chip 36.

Figure 4D:
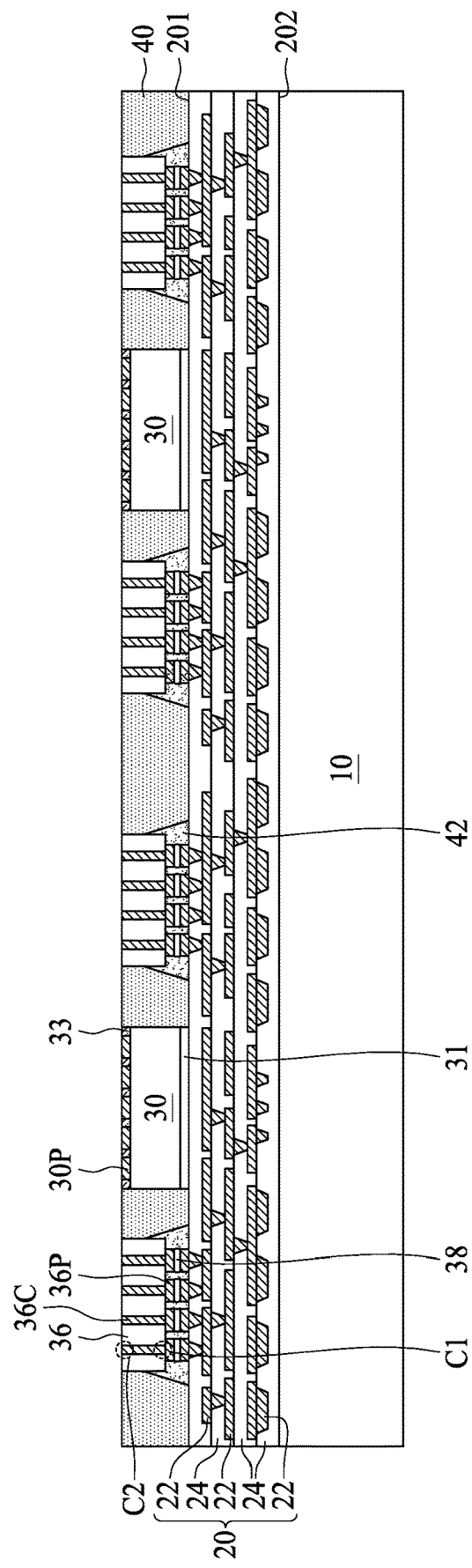

As depicted in FIG. 4D, a portion of the first encapsulant 40 and the passivation layer 33 are removed to expose the second terminals C2 of the second chip 36 and the electrical terminals 30P of the first chip 30. In one or more embodiments, the first encapsulant 40 and the passivation layer 33 are thinned by grinding.

Figure 4E:
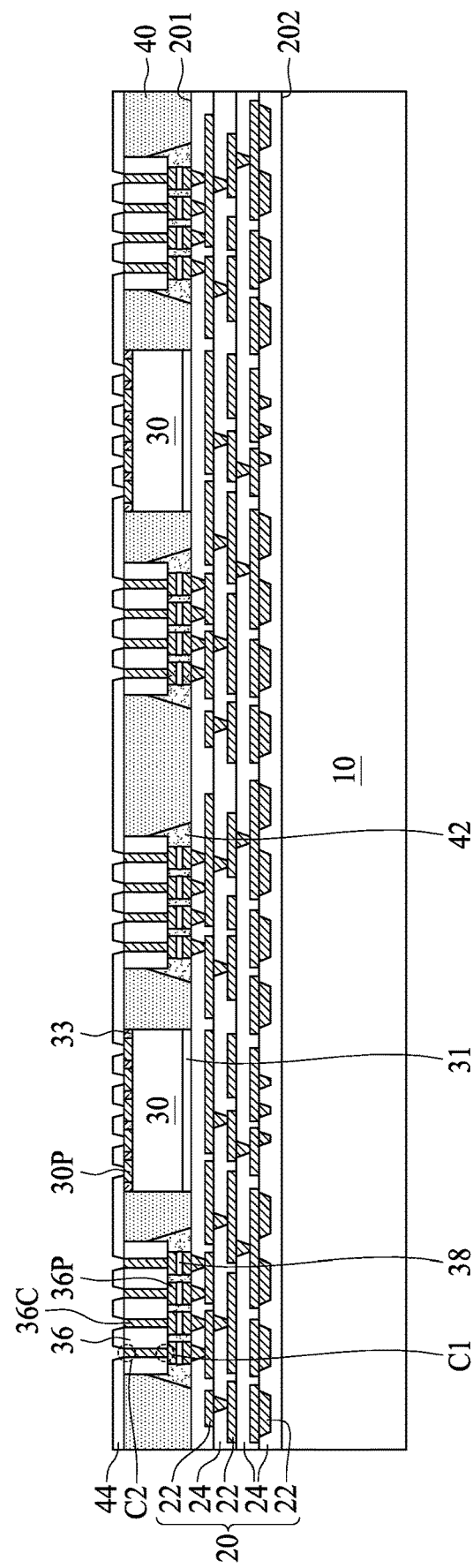

As depicted in FIG. 4E, an insulative layer 44 is formed over the first encapsulant 40. In one or more embodiments, the material of the insulative layer 44 may include, but is not limited to, organic insulative material such as PBO. The insulative layer 44 includes a number of openings exposing the second terminals C2 of the second chip 36 and the electrical terminals 30P of the first chip 30.

Figure 4F:
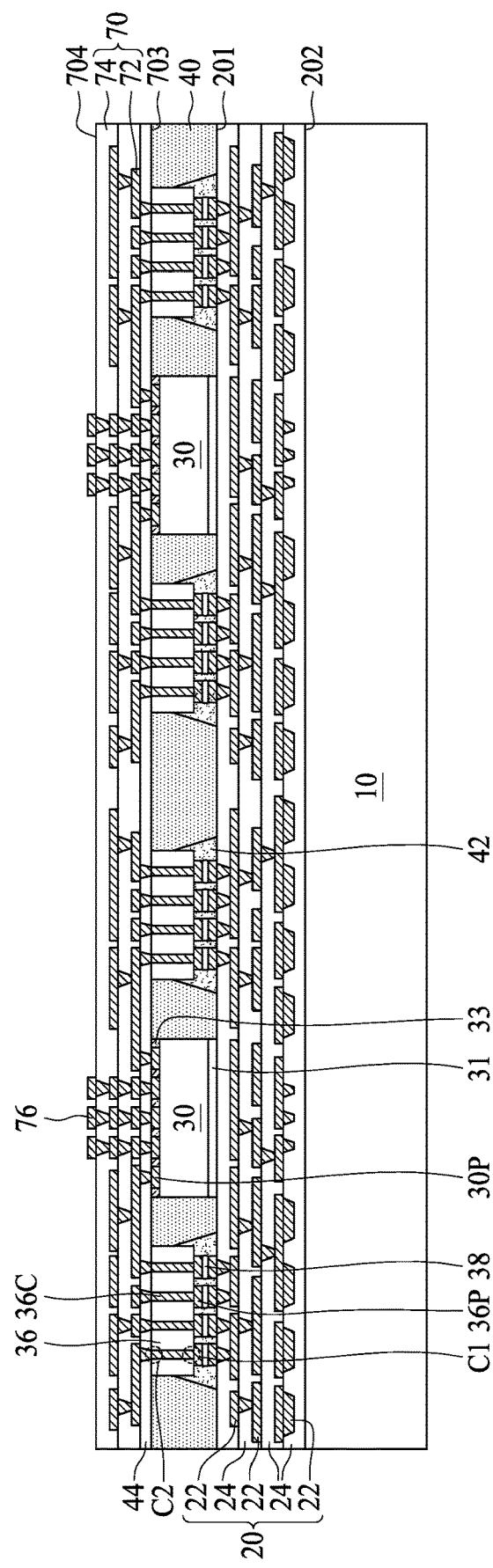

As depicted in FIG. 4F, a second redistribution layer 70 is formed over the first encapsulant 40. The second redistribution layer 70 has a third surface 703 and a fourth surface 704 opposite to each other, and the third surface 703 faces the first surface 201. The second redistribution layer 70 is electrically connected to the second chip 36 through the second terminals C2 and electrically connected to the first chip 30 through the electrical terminals 30P. In one or more embodiments, the second redistribution layer 70 includes several conductive layers 72 and several insulative layers 74 stacked with one another. In some embodiments, the material of the conductive layer(s) 72 may include, but is not limited to, metal such as copper, titanium, the like, or a combination thereof. The material of the insulative layer(s) 74 may include, but is not limited to, inorganic and/or organic insulative material. The first chip 30 is electrically connected to the second chip 36 through the second redistribution layer 70. In one or more embodiments, a portion of an upmost conductive layer 72 is exposed from the fourth surface 704 of the second redistribution layer 70. In one or more embodiments, several bonding pads 76 such as under bump metallurgies (UBMs) are formed over and electrically connected to the exposed portion of the upmost conductive layer 72 of the second redistribution layer 70.

Figure 4G:
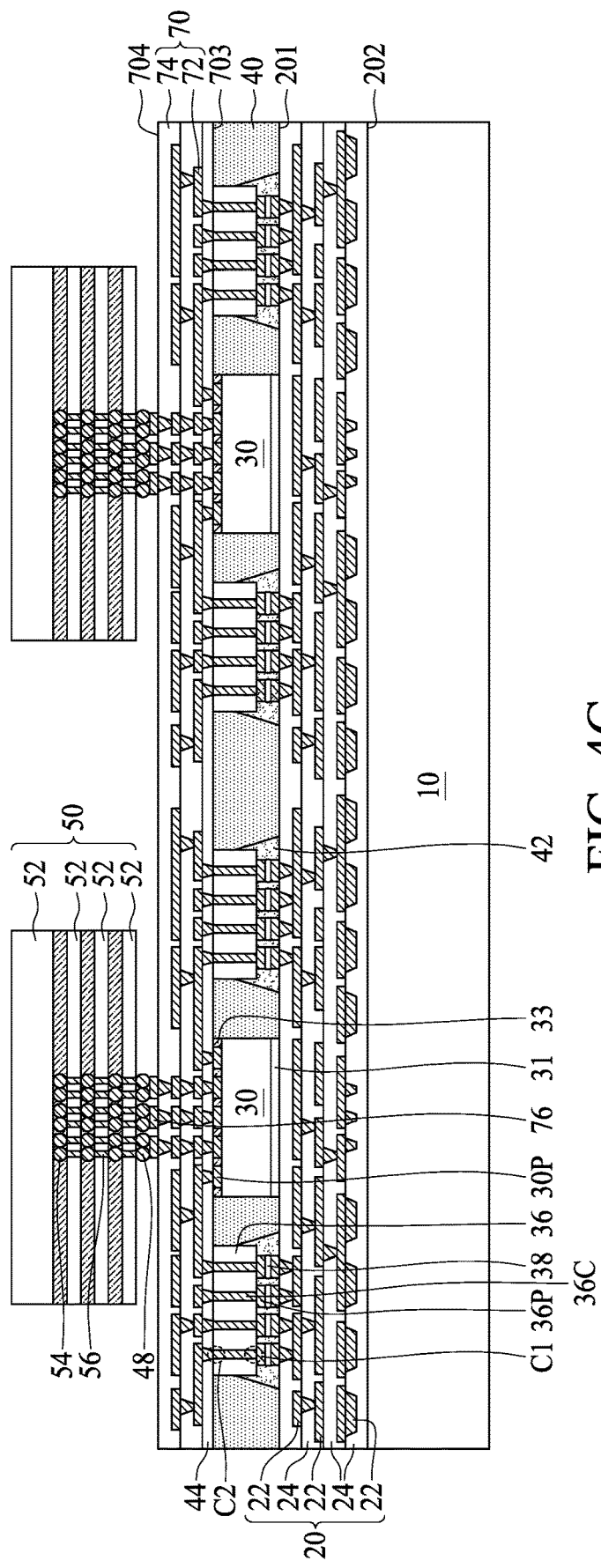

As depicted in FIG. 4G, one or more third chips 50 are disposed over and electrically connected to the second redistribution layer 70. The third chip 50 is electrically connected to first chip 30 through the second redistribution layer 70. In some embodiments, a portion of the electrical terminals 30P of the first chip 30 is electrically connected to the third chip 50 through a portion of the second redistribution layer 70, and another portion of the electrical terminals 30P of the first chip 30 is electrically connected to the second chip 36 through another portion of the second redistribution layer 70.

Figure 4H:
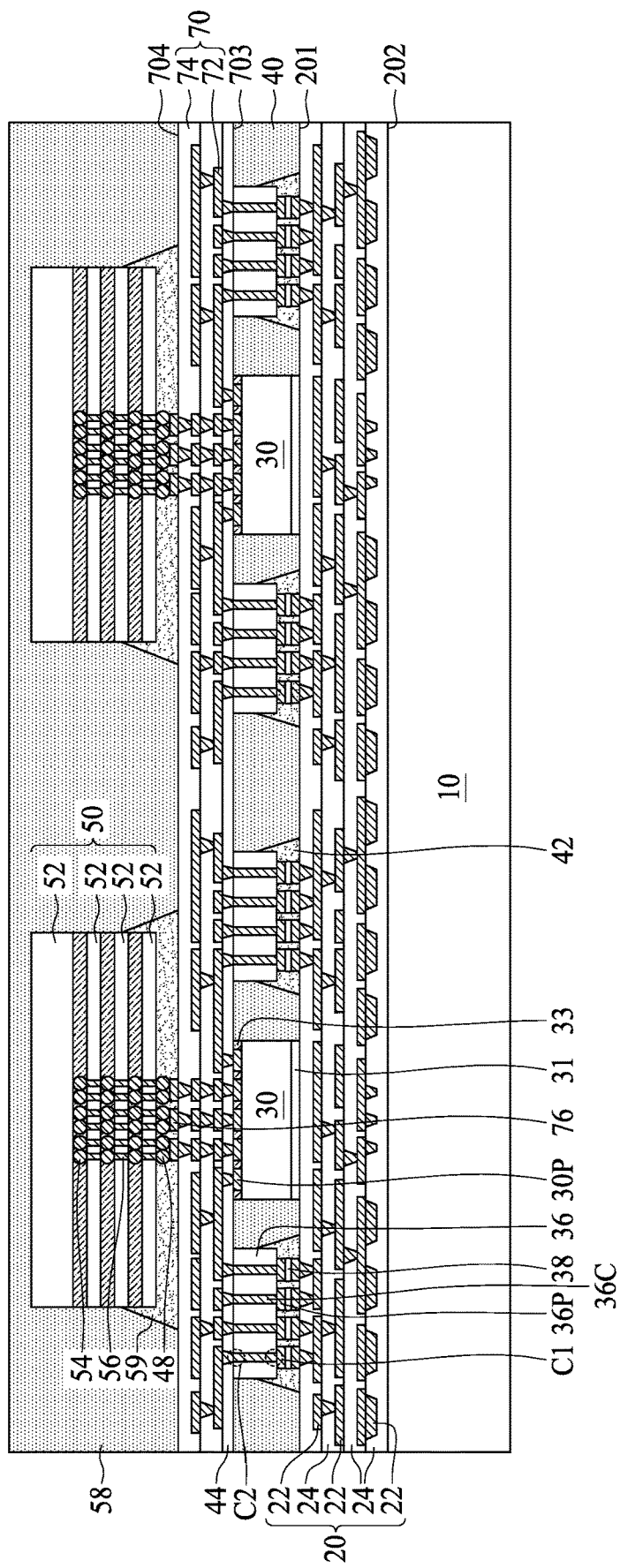

As depicted in FIG. 4H, a second encapsulant 58 is formed over the second redistribution layer 70, covering the third chip 50.

Figure 4I:
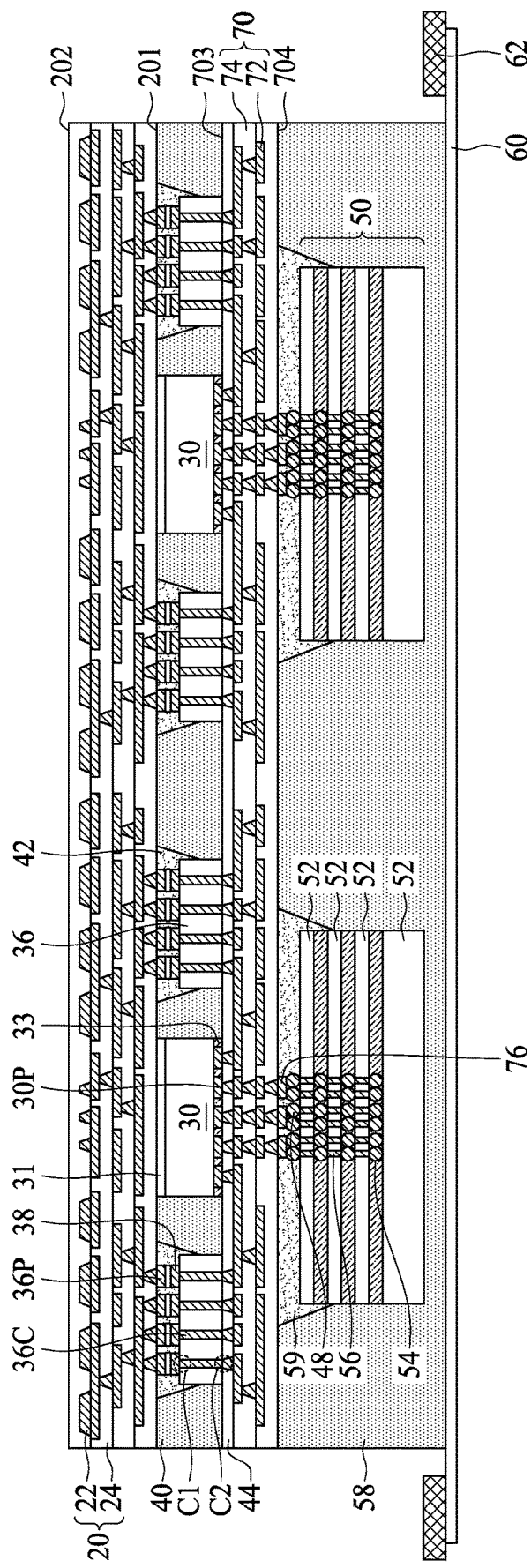

As depicted in FIG. 4I, the second encapsulant 58 is attached to a temporary substrate 60. The carrier substrate 10 is then detached from the second surface 202 of the first redistribution layer 20.

Figure 4J:
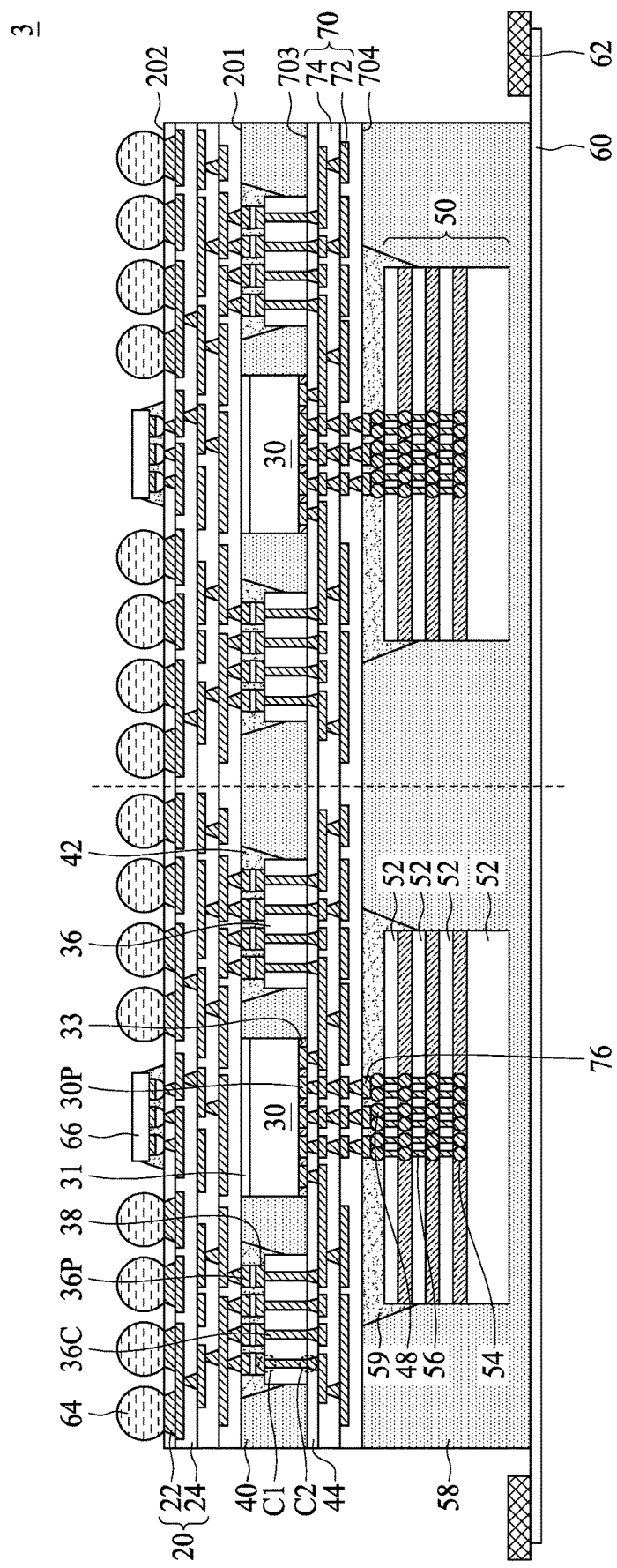
Figure 4K:
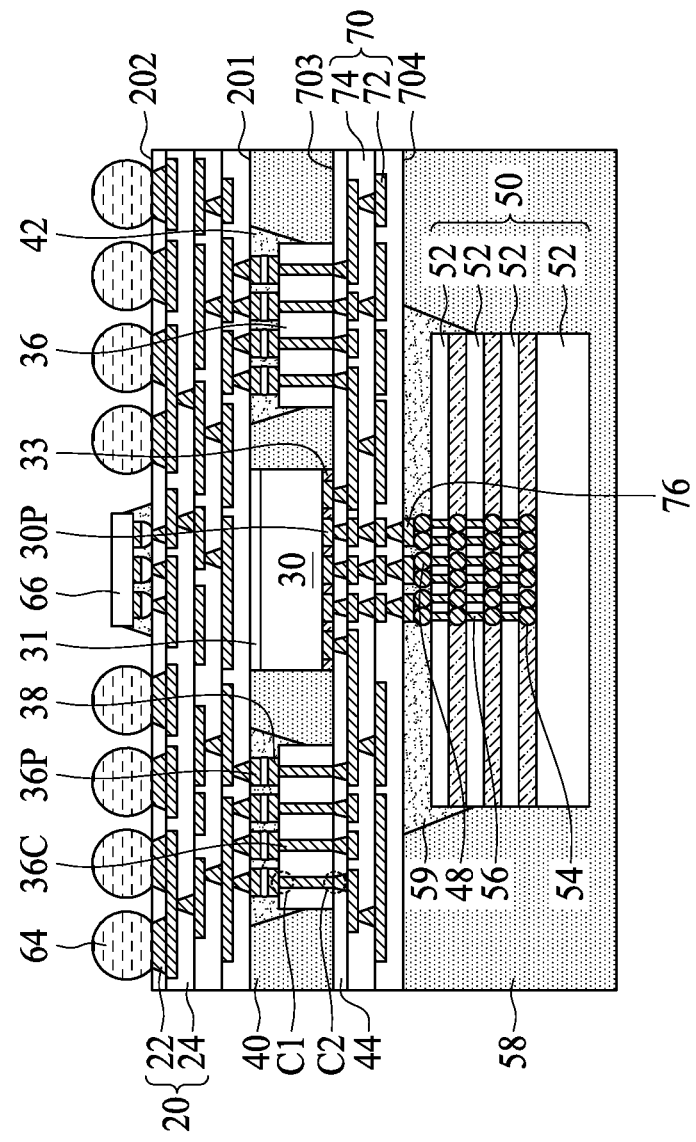

As depicted in FIG. 4J, a portion of the second redistribution layer 70 is removed from the fourth surface 704 to expose a bottommost conductive layer 72 configured as bonding pads. In one or more embodiments, the second redistribution layer 70 is removed by etching such as dry etching. A number of conductors 64 are formed over the fourth surface 704 of the second redistribution layer 70 and electrically connected to the second redistribution layer 70. In one or more embodiments, the conductors 64 include, but are not limited to, conductive bumps. In one or more embodiments, one or more fourth chips 66 are disposed over the second surface 202 of the first redistribution layer 20 and electrically connected to the second redistribution layer 70. In one or more embodiment, a singulation operation is performed to form a number of semiconductor package structures 3. The semiconductor package structure 3 is then removed from the temporary substrate 60 as shown in FIG. 4K.

In the semiconductor package structure 3, the third chip 50 is electrically connected to the first chip 30 through the second redistribution layer 70. The first chip 30 is electrically connected to the second redistribution layer 70 through the electrical terminals 30P facing the second redistribution layer 70. The first chip 30 is also electrically connected to the first redistribution layer 20 through the second redistribution layer 70 and the second chip 36 having through via structures 36C with fine pitch. The second chip 36 avoids formation of through via structures in the first chip 30, which helps to improve yield of the first chip 30. The second chip 36 is configured to provide an increased number of I/O counts, which is integratable with chips with high I/O density such as memory chip.

Figure 5:
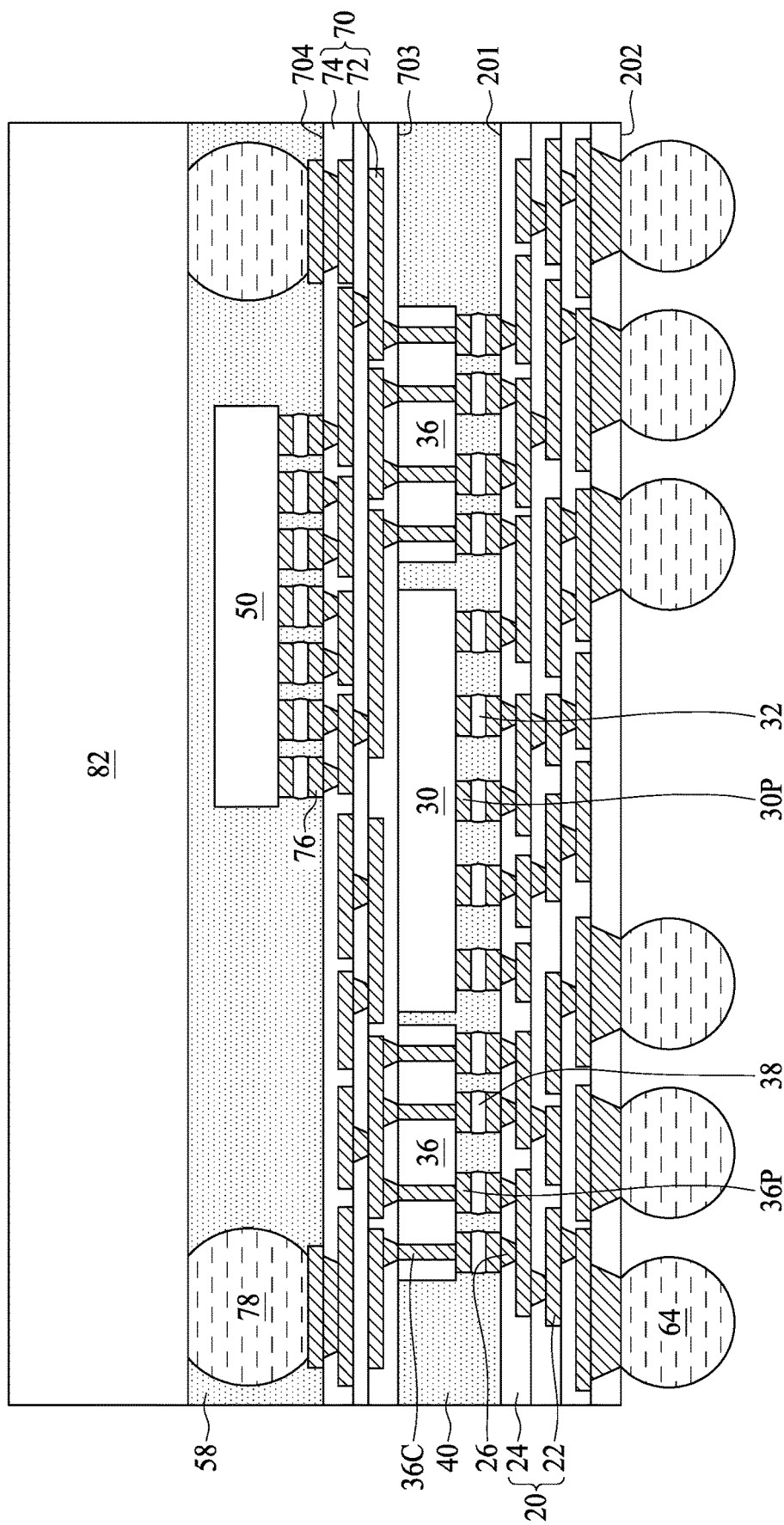
FIG. 5 is a cross-sectional view of a semiconductor package structure according to one or more embodiments of the present disclosure.

FIG. 5 is a cross-sectional view of a semiconductor package structure according to one or more embodiments of the present disclosure. As depicted in FIG. 5, the semiconductor package structure 4 includes a first redistribution layer 20, one or more first chips 30, one or more second chips 36, a first encapsulant 40, a second redistribution layer 70, and one or more third chips 50. The first chip 30 is disposed over the first redistribution layer 20 and electrically connected to the first redistribution layer 20 through the electrical terminals 30P. The second chips 36 are disposed over the first redistribution layer 20 and electrically connected to the first redistribution layer 20 and the second redistribution layer 70. The first encapsulant 40 is disposed over the first distribution layer 20, and surrounds the first chip 30 and the second chips 36. The second redistribution layer 70 is disposed over the first encapsulant 40. The third chip 50 is disposed over and electrically connected to the second redistribution layer 70. In one or more embodiments, the semiconductor package structure 4 further includes a second encapsulant 58 disposed over the second redistribution layer 70, and one or more fifth chips 82 disposed over the second encapsulant 58. In one or more embodiments, the fifth chip 82 is a package such as a memory package. In one or more embodiments, the second encapsulant 58 is a molding underfill (MUF) layer. In one or more embodiments, the second encapsulant 58 is an underfill (UF) layer. The fifth chip 82 is electrically connected to the second redistribution layer 70 through first interconnectors 78 in the second encapsulant 58. In one or more embodiments, the first interconnectors 78 are, but not limited to, conductive bumps.

Figure 6:
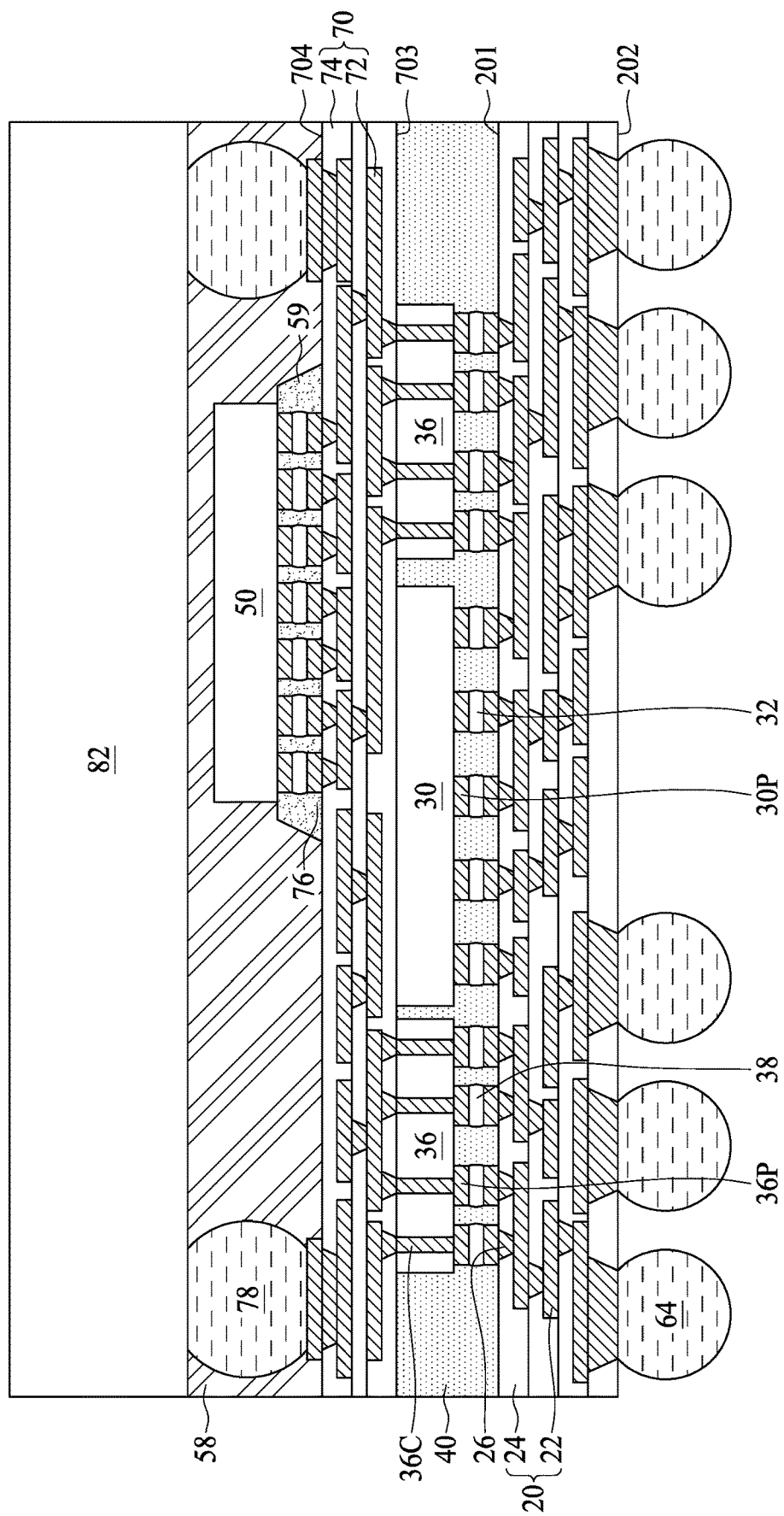
FIG. 6 is a cross-sectional view of a semiconductor package structure according to one or more embodiments of the present disclosure.

FIG. 6 is a cross-sectional view of a semiconductor package structure according to one or more embodiments of the present disclosure. As depicted in FIG. 6, different from the semiconductor package structure 4, the semiconductor package structure 5 further includes an underfill layer 59 between the third chip 50 and the second redistribution layer 70. In one or more embodiments, the second encapsulant 58 is configured as a second underfill layer surrounding the underfill layer 59.

Figure 7:
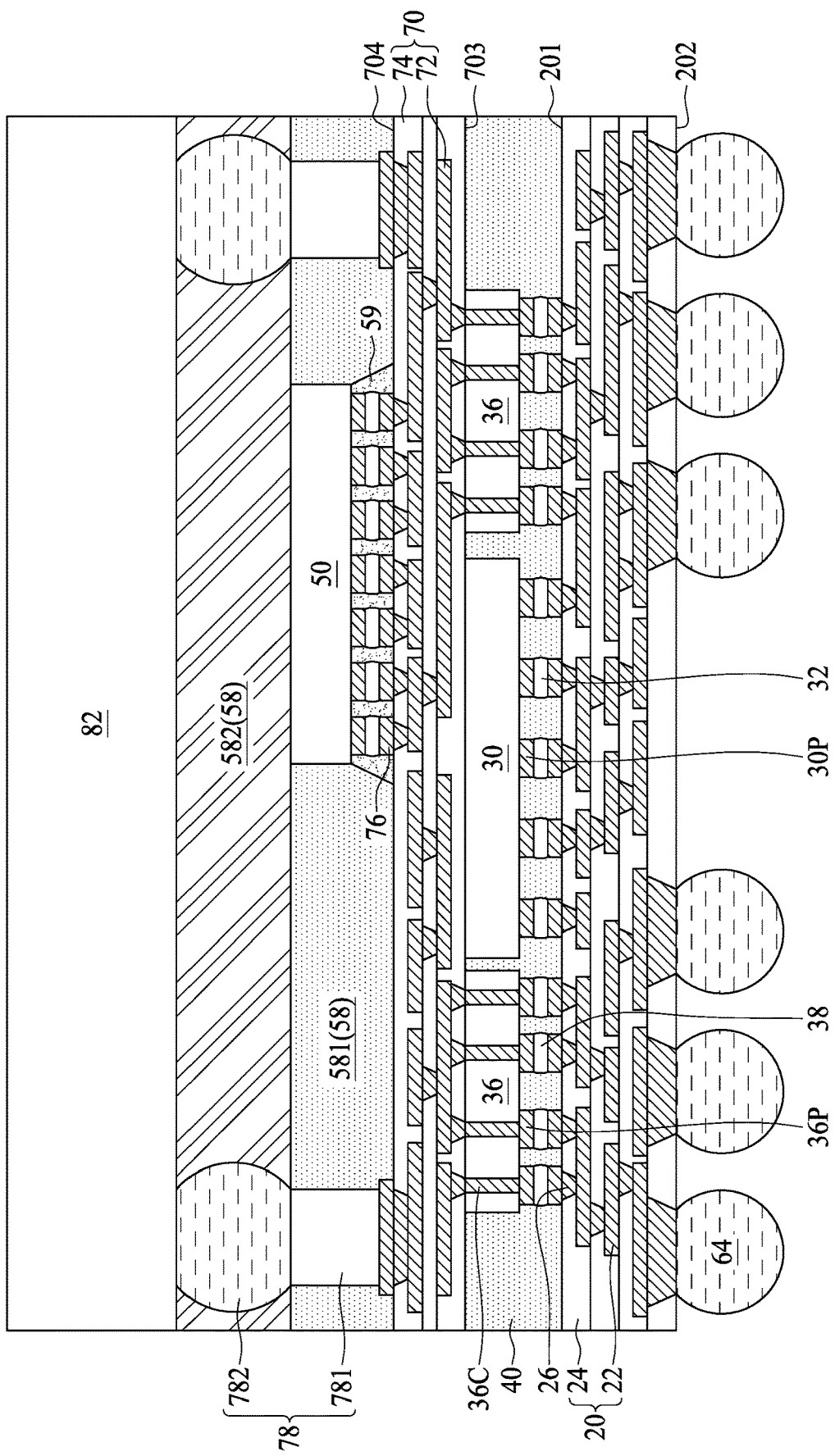
FIG. 7 is a cross-sectional view of a semiconductor package structure according to one or more embodiments of the present disclosure.

FIG. 7 is a cross-sectional view of a semiconductor package structure according to one or more embodiments of the present disclosure. As depicted in FIG. 7, different from the semiconductor package structure 5, the first interconnector 78 of the semiconductor package structure 6 includes a conductive bump 782 and a conductive post 781, and the conductive bump 782 is coupled to the conductive post 781. In one or more embodiments, the conductive bump 782 is a solder bump or a solder paste, where one end of the conductive bump 782 is electrically connected to the fifth chip 82, and the other end is electrically connected to the respective conductive post 781. The fabrication and the materials of the conductive posts 781 and the conductive bumps 782 are different. In one or more embodiments, the conductive posts 781 are formed by deposition, photolithography and etching operations, and thus the pitch between adjacent conductive posts 781 can be reduced. Accordingly, the conductive post 781 in association with the conductive bump 782 is able to fulfill fine-pitch joint between the second redistribution layer 70 and the fifth chips 82. In one or more embodiments, the second encapsulant 58 includes a molding compound 581 and an underfill layer 582 over the molding compound 581. The molding compound 581 is disposed over the second redistribution layer 70, and surrounding sidewalls of the first chip 30 and the conductive post 781. The underfill layer 582 surrounds sidewalls of the conductive bumps 782.

Figure 8A:
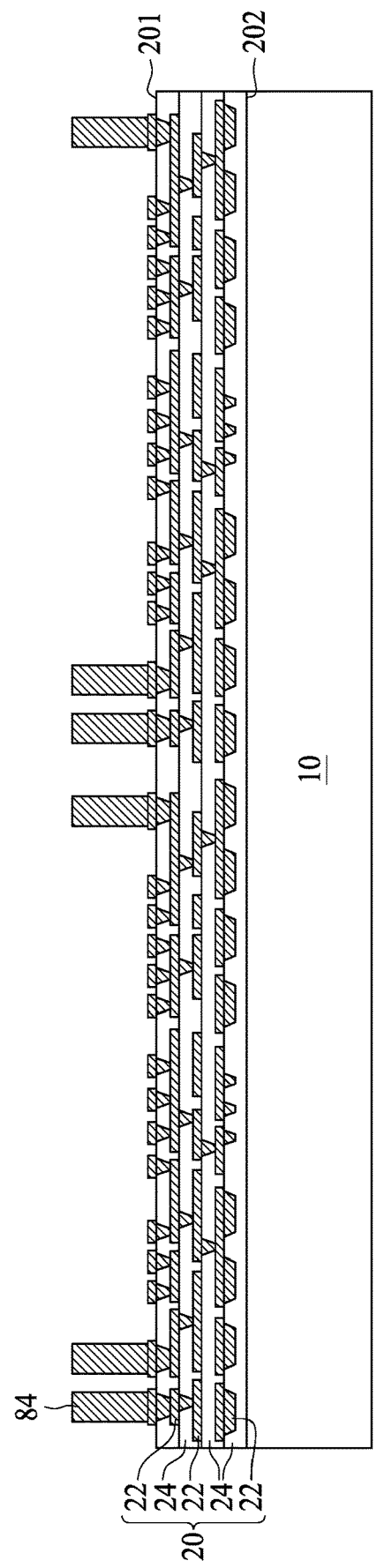
FIG. 8A, FIG. 8B, FIG. 8C, FIG. 8D, FIG. 8E, FIG. 8F, FIG. 8G, FIG. 8H and FIG. 8I are cross-sectional views at one of various operations of manufacturing semiconductor package structure according to one or more embodiments of the present disclosure.

FIG. 8A, FIG. 8B, FIG. 8C, FIG. 8D, FIG. 8E, FIG. 8F, FIG. 8G, FIG. 8H and FIG. 8I are cross-sectional views at one of various operations of manufacturing semiconductor package structure according to one or more embodiments of the present disclosure. As depicted in FIG. 8A, a first redistribution layer 20 is formed over a carrier substrate 10. In one or more embodiments, second interconnectors 84 are formed over and electrically connected to the first surface 201 of the first redistribution layer 20. In some embodiments, the second interconnectors 84 are through insulator vias (TIVs).

Figure 8B:
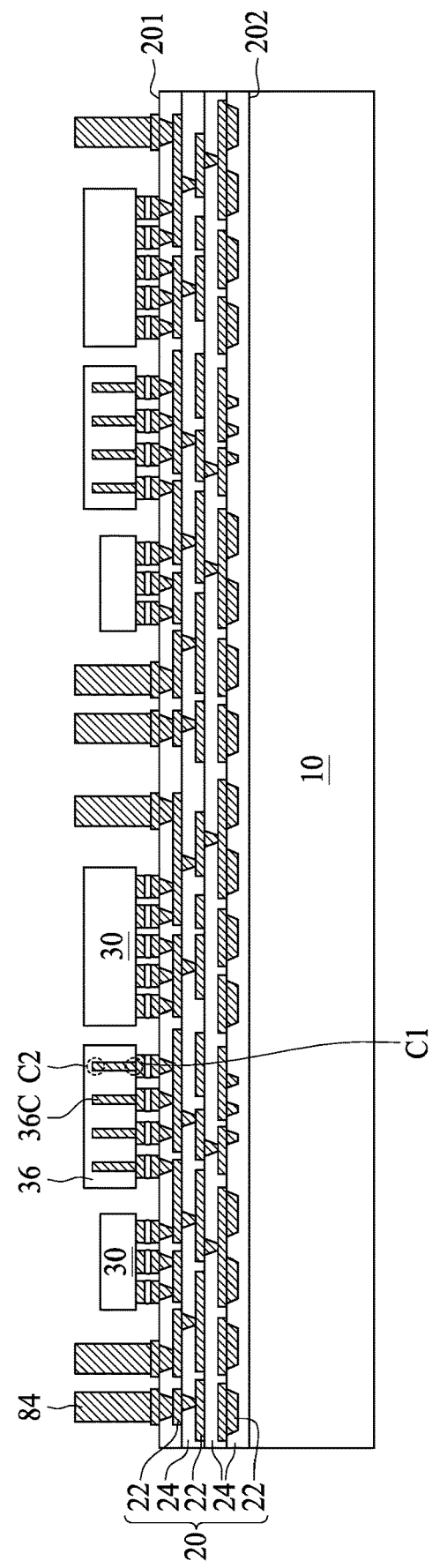

As depicted in FIG. 8B, one or more first chips 30 are disposed over the first surface 201 of the first redistribution layer 20. One or more second chips 36 are disposed over the first redistribution layer 20, and electrically connected to the first redistribution layer 20. In some embodiments, the first chips 30 may include different types of chips and may have different thicknesses. By way of example, some of the first chips 30 may include active device chips such as system on chip (SOC), and some of the first chips 30 may include passive device chips.

Figure 8C:
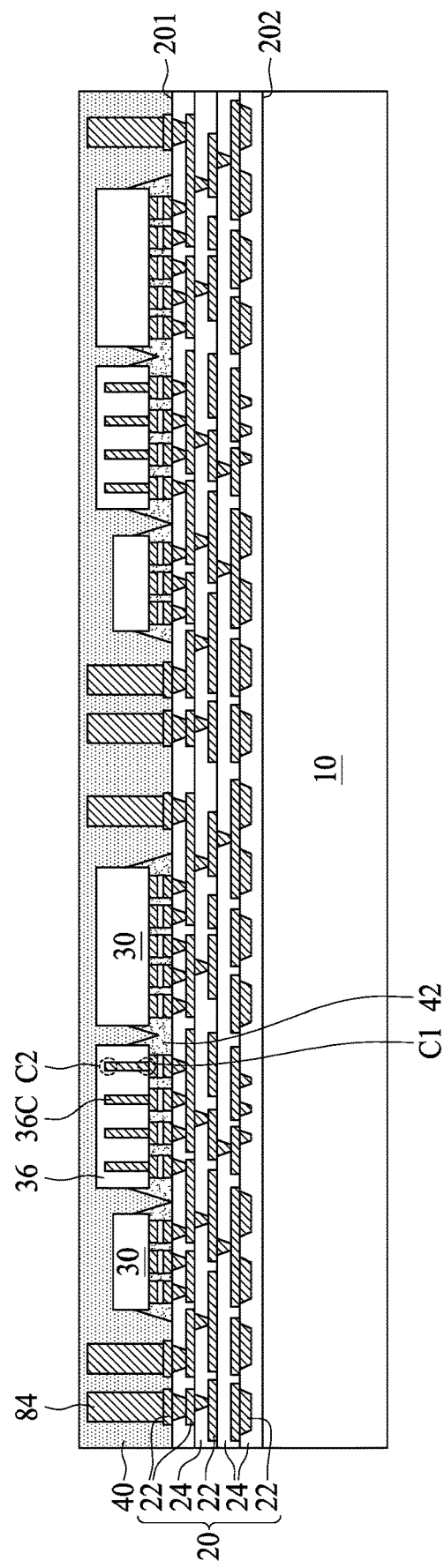

As depicted in FIG. 8C, a first encapsulant 40 is formed over the first surface 201 of first redistribution layer 20. In one or more embodiments, the material of the first encapsulant 40 is a molding compound. In some embodiments, an underfill layer 42 may be formed between the first chip 30 and the first redistribution layer 20, and between the second chip 36 and the first redistribution layer 20. In some embodiments, the first encapsulant 40 is a molding underfill (MUF) layer and thus an additional underfill layer may not be required.

Figure 8D:
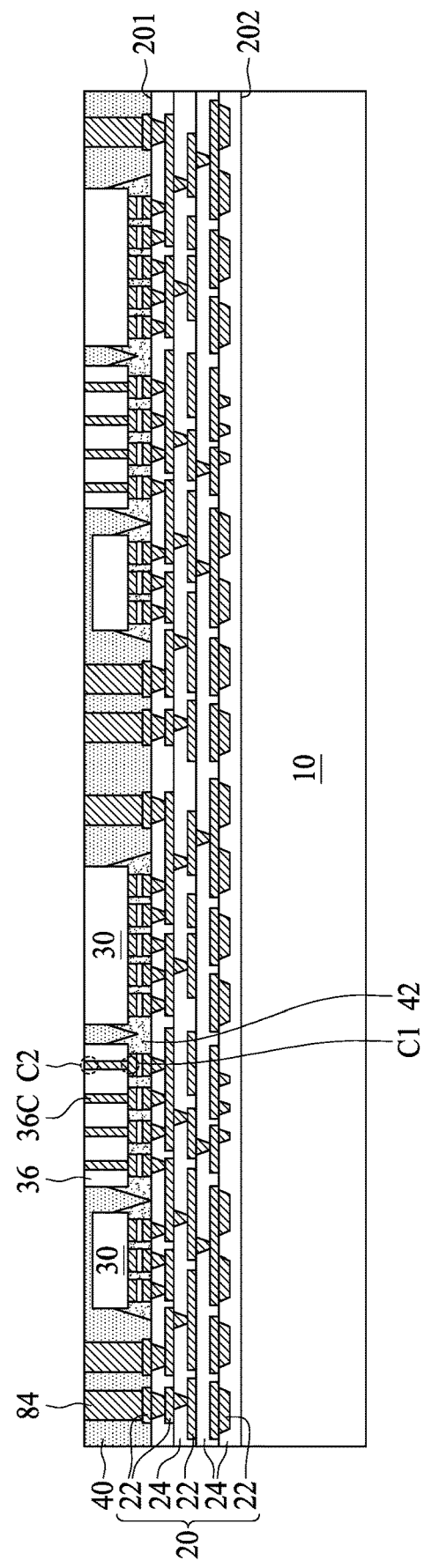

As depicted in FIG. 8D, a portion of the first encapsulant 40 is removed by, e.g., grinding, to expose the second terminals C2 of the second chip 36.

Figure 8E:
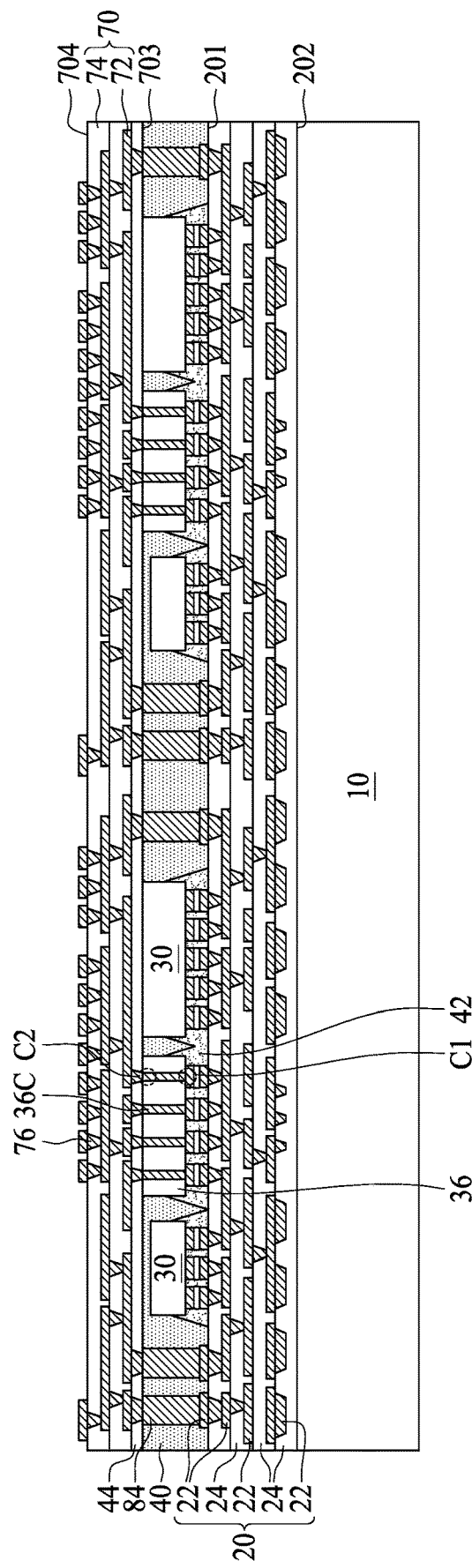

As depicted in FIG. 8E, an insulative layer 44 is formed over the first encapsulant 40. The insulative layer 44 includes openings exposing the second terminals C2 of the second chip 36. A second redistribution layer 70 is formed over the first encapsulant 40. The second redistribution layer 70 is electrically connected to the second chip 36 through the second terminals C2. In one or more embodiments, the second redistribution layer 70 includes several conductive layers 72 and several insulative layers 74 stacked with one another. In one or more embodiments, a portion of an upmost conductive layer 72 is exposed from the fourth surface 704 of the second redistribution layer 70. In one or more embodiments, several bonding pads 76 such as under bump metallurgies (UBMs) are formed over and electrically connected to the exposed portion of the upmost conductive layer 72 of the second redistribution layer 70.

Figure 8F:
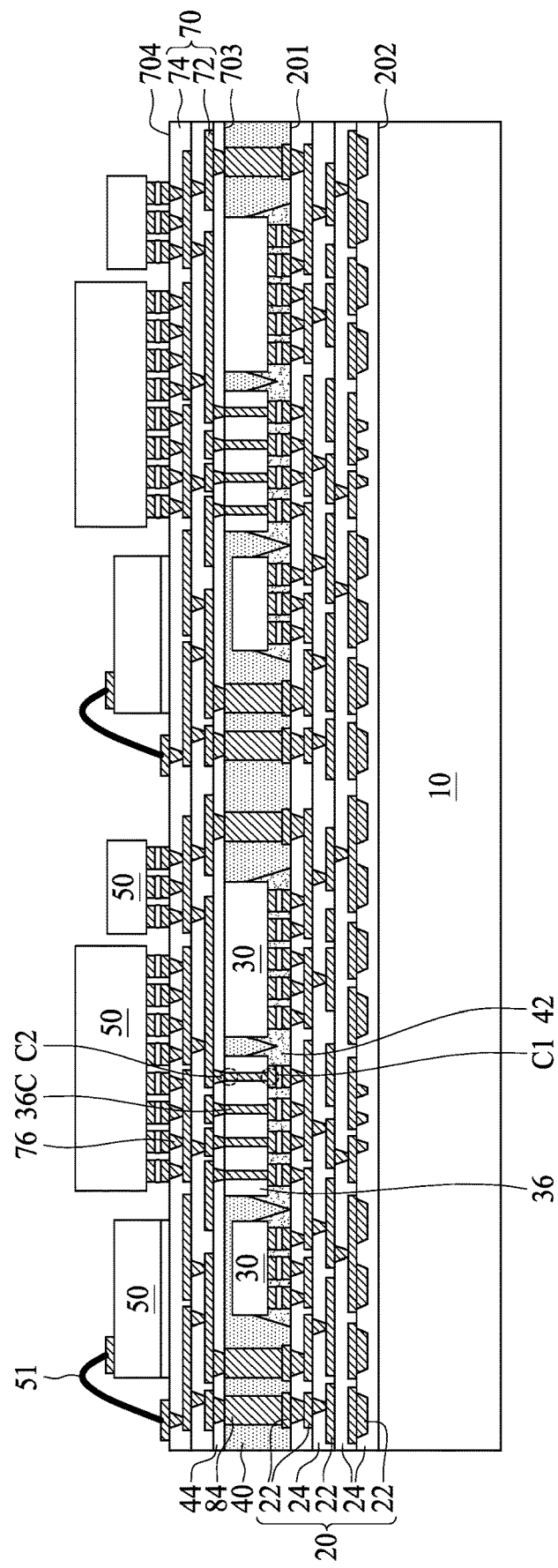

As depicted in FIG. 8F, one or more third chips 50 are disposed over and electrically connected to the second redistribution layer 70. In some embodiments, a portion of the third chips 50 is electrically connected to the first redistribution layer 20 through the second redistribution layer 70 and the first chip 30. In some embodiments, another portion of the third chips 50 is electrically connected to the first redistribution layer 20 through the second redistribution layer 70 and the second interconnectors 84. In some embodiments, a portion of the third chips 50 is electrically connected to the second redistribution layer 70 via bonding wires 51 such as gold wires. In one or more embodiments, the third chips 50 include memory chips, optoelectronic chips, MEMS chips, passive chips or a combination thereof.

Figure 8G:
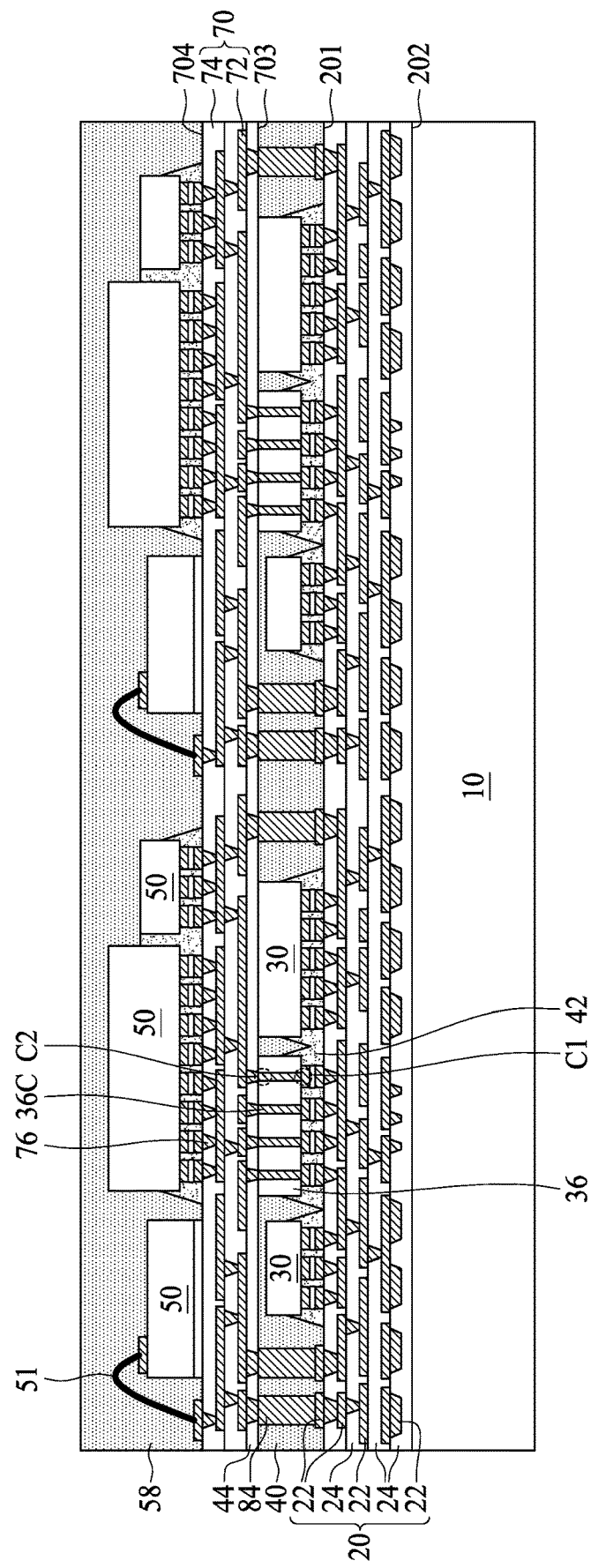

As depicted in FIG. 8G, a second encapsulant 58 is formed over the second redistribution layer 70, covering the third chips 50.

Figure 8H:
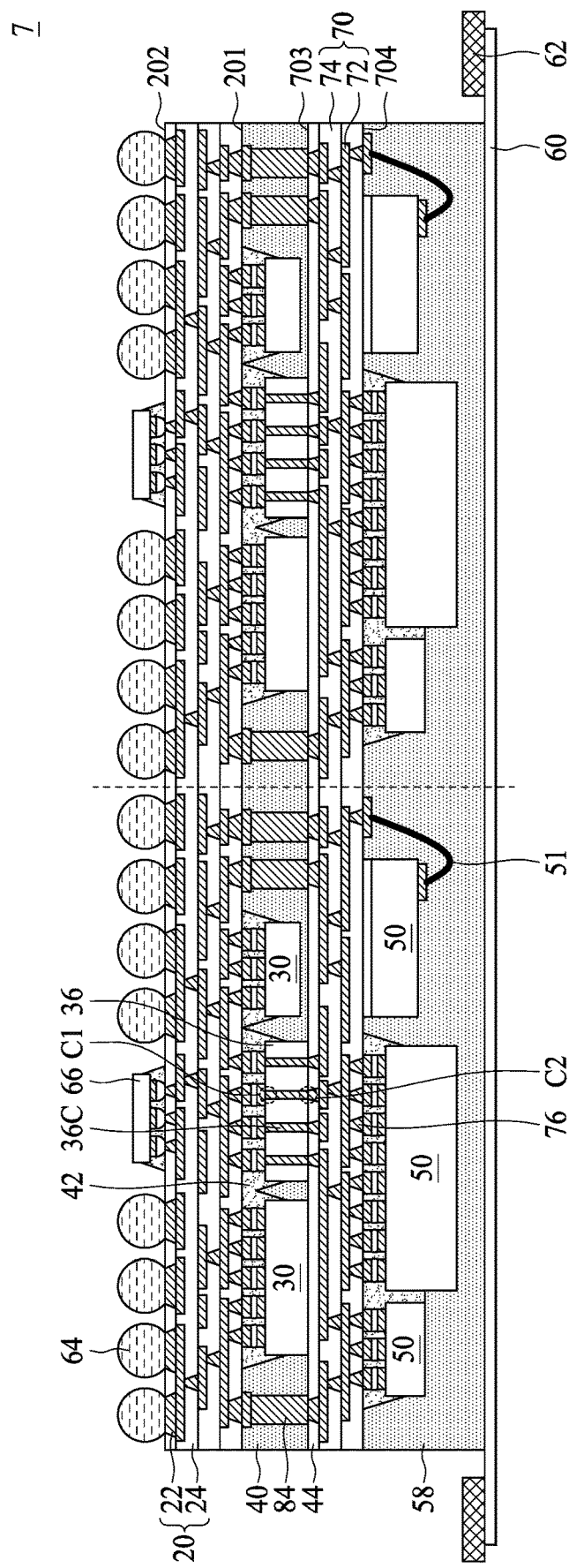
Figure 8I:
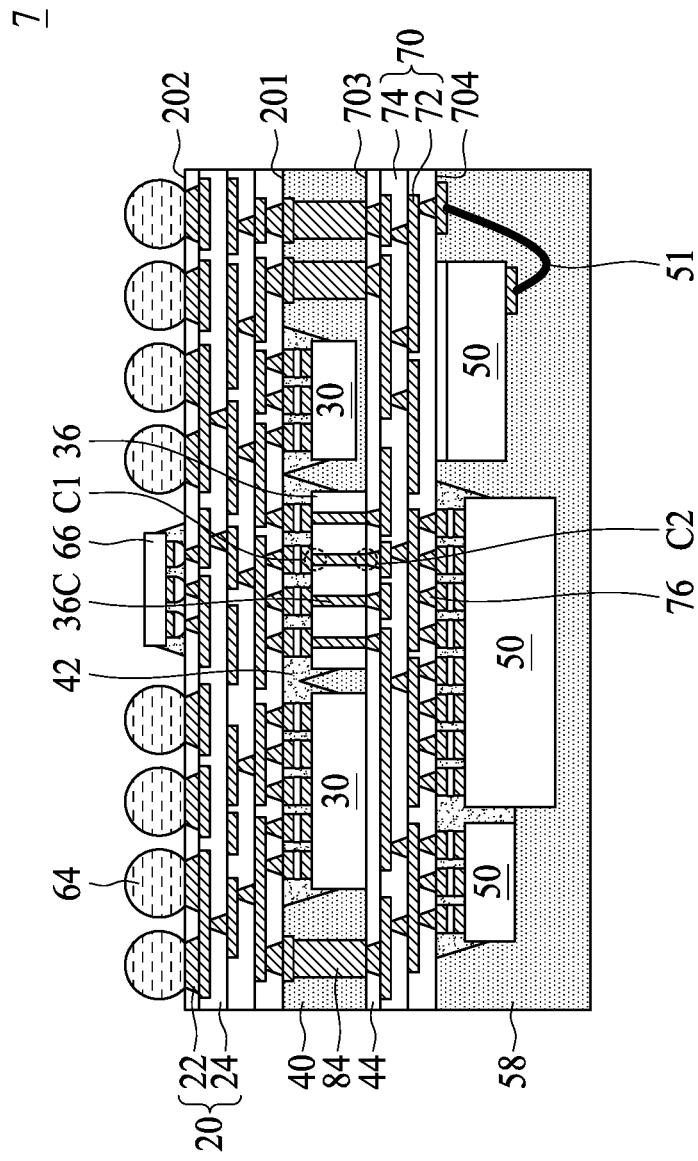

As depicted in FIG. 8H, the second encapsulant 58 is attached to a temporary substrate 60. The carrier substrate 10 is then detached from the second surface 202 of the first redistribution layer 20. In some embodiments, a portion of the second redistribution layer 70 is removed from the fourth surface 704 to expose a bottommost conductive layer 72 configured as bonding pads. In one or more embodiments, the second redistribution layer 70 is removed by etching such as dry etching. A number of conductors 64 are formed over the fourth surface 704 of the second redistribution layer 70 and electrically connected to the second redistribution layer 70. In one or more embodiments, the conductors 64 include, but are not limited to, conductive bumps. In one or more embodiments, one or more fourth chips 66 are disposed over the second surface 202 of the first redistribution layer 20 and electrically connected to the second redistribution layer 70. In one or more embodiment, a singulation operation is performed to form a number of semiconductor package structures 7. The semiconductor package structure 7 is then removed from the temporary substrate 60 as shown in FIG. 8I.

Figure 9:
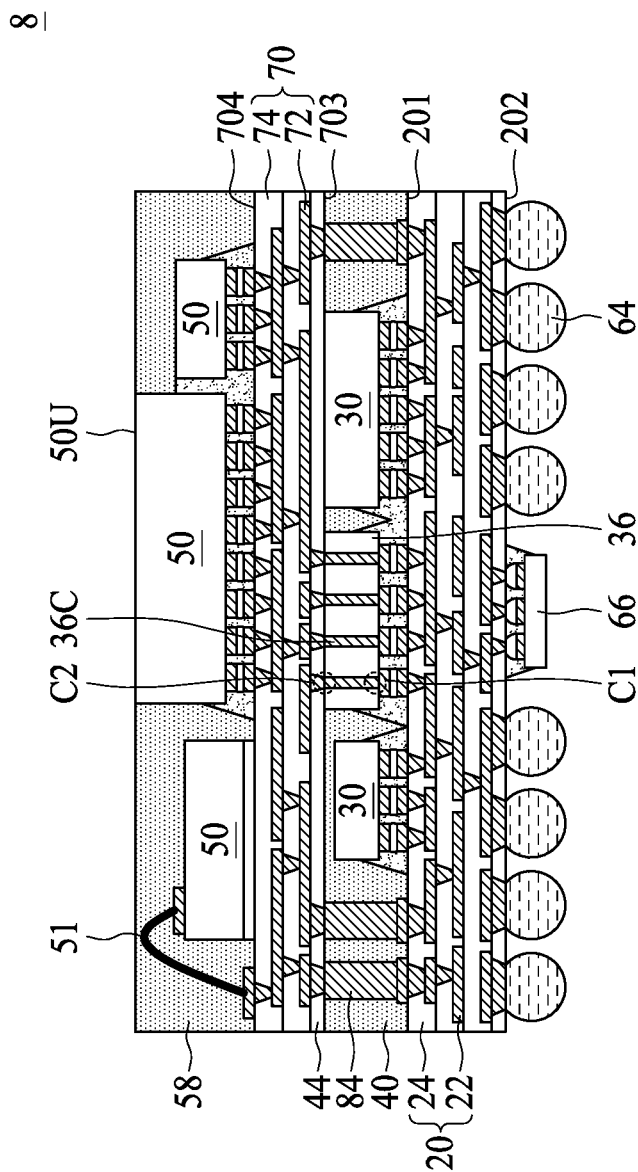
FIG. 9 is a cross-sectional view of a semiconductor package structure according to one or more embodiments of the present disclosure.

FIG. 9 is a cross-sectional view of a semiconductor package structure according to one or more embodiments of the present disclosure. As depicted in FIG. 9, an upper surface 50U of one or more third chips 50 of the semiconductor package structure 8 is exposed from the second encapsulant 58 such that the third chip 50 is able to build external communication. In some embodiments, the third chips 50 may include optoelectronic chips such as CMOS image sensor chips, MEMS chips, and high power chips.

Figure 10:
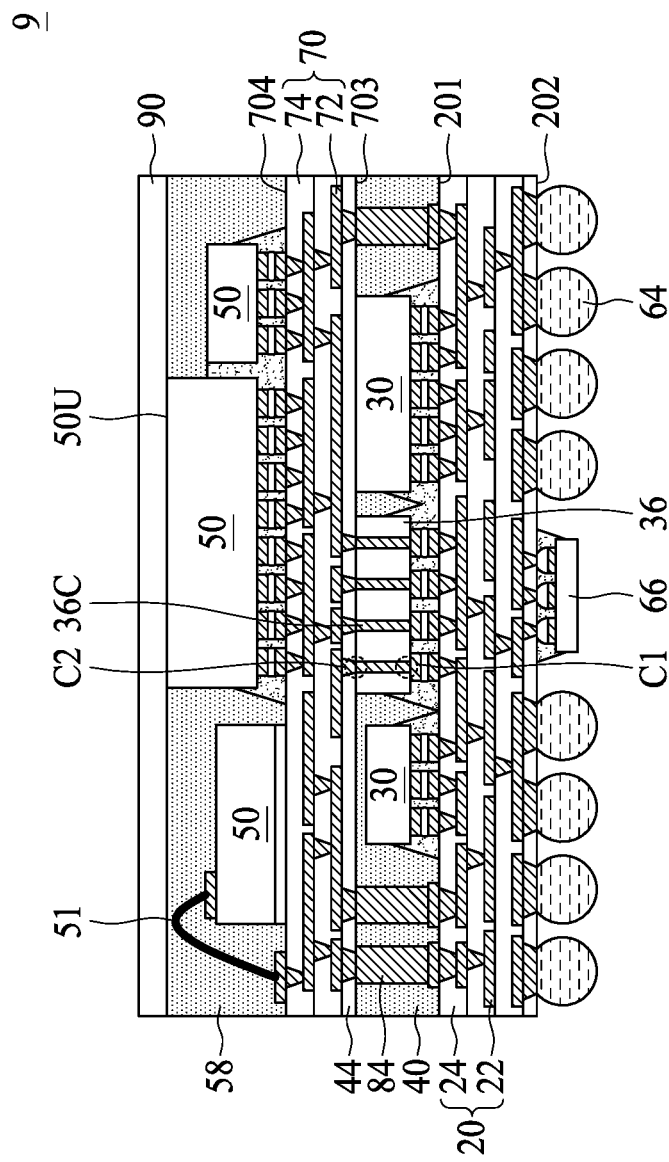
FIG. 10 is a cross-sectional view of a semiconductor package structure according to one or more embodiments of the present disclosure.

FIG. 10 is a cross-sectional view of a semiconductor package structure according to one or more embodiments of the present disclosure. As depicted in FIG. 10, the semiconductor package structure 9 further includes a heat spreader 90 over the second encapsulant 58 and the third chip 50. The heat spreader 90 is formed from material with high heat conductivity such as metal, and configured to improve heat dissipation of the third chip 50. In some embodiments, the third chips 50 may include optoelectronic chips such as CMOS image sensor chips, MEMS chips, memory chips, high power chips, other chips that generate heat during operation, or other heat-sensitive chips.

In one or more embodiments, the semiconductor package structure includes several stacked electronic devices such as chips. A second chip including through via structures is disposed to provide high density interconnection between two electronic devices and high flexibility in routing. The second chip provides a short signal path for the interconnection between the chips. In one or more embodiments, the semiconductor package structure is a fan-out wafer-level package (FOWLP). In one or more embodiments, the semiconductor package structure is compatible with multi-layer stacked chips with small form factor. In one or more embodiments, the semiconductor package structure is compatible with heterogeneous integration design in which different electronic devices such as semiconductor dies, chips, packages and interposers with different sizes and thicknesses can be integrated. In one or more embodiments, the semiconductor package structure is compatible with heat spreader to increase heat dissipation ability.

In one exemplary aspect, a semiconductor package structure includes a redistribution (RDL) layer, a first chip, a second chip, an encapsulant and a third chip. The redistribution layer has a first surface and a second surface opposite to each other. The first chip is over the first surface of the redistribution layer and electrically connected to the redistribution layer. The second chip is over the first surface of the redistribution layer and electrically connected to the redistribution layer. The second chip includes a plurality of through via structures. The encapsulant is over the first surface of the distribution layer, wherein the encapsulant surrounds the first chip and the second chip. The third chip is over the encapsulant and electrically connected to the first chip through the through via structures of the second chip and the redistribution layer.

In another exemplary aspect, a semiconductor package structure includes a first redistribution layer (RDL), a first chip, a second chip, a first encapsulant, a second redistribution layer, a third chip and a second encapsulant. The first redistribution layer has a first surface and a second surface opposite to each other. The first chip is over the first surface of the first redistribution layer. The second chip is over the first surface of the first redistribution layer. The second chip includes a plurality of through via structures, and a first terminal of the through via structure is coupled to the first redistribution layer. The first encapsulant is over the first surface of the first distribution layer, wherein the first encapsulant surrounds the first chip and the second chip. The second redistribution layer is over the first encapsulant and electrically connected to a second terminal of the through via structure. The second redistribution layer has a third surface and a fourth surface opposite to each other, and the third surface faces the first surface. The third chip is over the fourth surface of the second redistribution layer, and electrically connected to the second redistribution layer. The second encapsulant is over the second redistribution layer.

In yet another aspect, a method for manufacturing a semiconductor package structure includes the following operations. A first redistribution layer is formed. A first chip is disposed over the first redistribution layer. A second chip is disposed over the first redistribution layer, where the second chip includes a plurality of through via structures. An encapsulant is formed over the first redistribution layer. A third chip is formed over the encapsulant, where the third chip and the first redistribution layer are electrically connected through the through via structures of the second chip.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure, comprising:
   a redistribution layer having a first surface and a second surface opposite to each other;
   a first chip over the first surface of the redistribution layer and electrically connected to the redistribution layer;
   a second chip over the first surface of the redistribution layer, wherein the second chip includes a plurality of through via structures;
   an encapsulant over the first surface of the redistribution layer, wherein the encapsulant surrounds the first chip and the second chip;
   a third chip over the encapsulant and electrically connected to the first chip through the through via structures of the second chip and the redistribution layer;
   a fourth chip over the second surface of the redistribution layer and electrically connected to the redistribution layer; and
   a plurality of conductors disposed over the second surface of the redistribution layer and electrically connected to the redistribution layer, wherein the fourth chip and the plurality of conductors are disposed substantially at the same level over the second surface.

2. The semiconductor package structure of claim 1, wherein the first chip includes a plurality of electrical terminals facing the first surface of the redistribution layer and electrically connected to the redistribution layer.

3. The semiconductor package structure of claim 1, wherein a first terminal of the through via structure is coupled to the redistribution layer, and a second terminal of the through via structure is coupled to the third chip.

4. The semiconductor package structure of claim 1, wherein the first chip and the second chip are at substantially the same level over a circuit layer.

5. The semiconductor package structure of claim 1, wherein a height of the fourth chip is smaller than heights of the plurality of conductors.

6. A semiconductor package structure, comprising:
   a first redistribution layer having a first surface and a second surface opposite to each other;
   a first chip over the first surface of the first redistribution layer;
   a second chip over the first surface of the first redistribution layer, wherein the second chip includes a plurality of through via structures, and a first terminal of the through via structure is coupled to the first redistribution layer;
   a first encapsulant over the first surface of the first redistribution layer, wherein the first encapsulant surrounds the first chip and the second chip;
   a second redistribution layer over the first encapsulant and electrically connected to a second terminal of the through via structure, wherein the second redistribution layer has a third surface and a fourth surface opposite to each other, and the third surface faces the first surface;
   a third chip over the fourth surface of the second redistribution layer, and electrically connected to the second redistribution layer;
   a second encapsulant over the second redistribution layer;
   a fourth chip over the second surface of the first redistribution layer and electrically connected to the first redistribution layer; and
   a plurality of conductors disposed over the second surface of the first redistribution layer and electrically connected to the first redistribution layer, wherein the fourth chip and the plurality of conductors are disposed substantially at the same level over the second surface.

7. The semiconductor package structure of claim 6, wherein the first chip includes a plurality of electrical terminals facing and electrically connected to the third surface of the second redistribution layer, a portion of the electrical terminals of the first chip is electrically connected to the third chip through a portion of the second redistribution layer, and another portion of the electrical terminals of the first chip is electrically connected to the second chip through another portion of the second redistribution layer.

8. The semiconductor package structure of claim 6, further comprising a plurality of interconnectors in the first encapsulant and electrically to the first redistribution layer and the second redistribution layer.

9. The semiconductor package structure of claim 8, wherein the interconnectors are through insulator vias.

10. The semiconductor package structure of claim 6, wherein the second encapsulant exposes an upper surface of the third chip.

11. The semiconductor package structure of claim 6, wherein a height of the fourth chip is smaller than heights of the plurality of conductors.

12. A semiconductor package structure, comprising:
    a first chip and a second chip over a first surface of a circuit layer;
    a plurality of through via structures in the second chip;
    a third chip over the first chip and the second chip, and electrically connected to the first chip through the through via structures and the circuit layer;
    an encapsulant over the first surface of the circuit layer;
    a second circuit layer over the encapsulant, the second circuit layer having a surface facing the first surface of the circuit layer, wherein the first chip includes a plurality of electrical terminals facing and electrically connected to the surface of the second circuit layer, a portion of the electrical terminals of the first chip is electrically connected to the third chip through a portion of the second circuit layer, and another portion of the electrical terminals of the first chip is electrically connected to the second chip through another portion of the second circuit layer;

a fourth chip over a second surface of the circuit layer and electrically connected to the circuit layer; and a plurality of conductors disposed over the second surface of the circuit layer and electrically connected to the circuit layer, wherein the fourth chip and the plurality of conductors are disposed at substantially the same level over the second surface.

13. The semiconductor package structure of claim 12, wherein the first chip and the second chip are at substantially the same level over the circuit layer.

14. The semiconductor package structure of claim 12, wherein the first chip and the second chip have substantially the same height.

15. The semiconductor package structure of claim 12, wherein a height of the fourth chip is smaller than heights of the plurality of conductors.

16. The semiconductor package structure of claim 12, further comprising a second encapsulant over the second circuit layer.

17. The semiconductor package structure of claim 16, further comprising a fifth chip over the second encapsulant.

18. The semiconductor package structure of claim 17, further comprising a plurality of interconnectors in the second encapsulant and electrically connected to the second circuit layer.

19. The semiconductor package structure of claim 18, wherein the interconnector comprises a conductive bump.

20. The semiconductor package structure of claim 18, wherein the interconnector comprises a conductive post and a conductive bump stacked on the conductive post.

* * * * *